US012575206B2

(12) United States Patent
Kim et al.

(10) Patent No.: US 12,575,206 B2
(45) Date of Patent: Mar. 10, 2026

(54) IMAGE SENSOR, METHOD OF MANUFACTURING IMAGE SENSOR, AND ELECTRONIC DEVICE INCLUDING IMAGE SENSOR

(71) Applicant: SAMSUNG ELECTRONICS CO., LTD., Suwon-si (KR)

(72) Inventors: Seaum Kim, Seoul (KR); Hongkyu Park, Yongin-si (KR); Seokho Yun, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 508 days.

(21) Appl. No.: 17/971,932

(22) Filed: Oct. 24, 2022

(65) Prior Publication Data

US 2023/0154958 A1 May 18, 2023

(30) Foreign Application Priority Data

Nov. 18, 2021 (KR) ........................ 10-2021-0159780

(51) Int. Cl.
*H10F 39/00* (2025.01)

(52) U.S. Cl.
CPC ....... *H10F 39/8063* (2025.01); *H10F 39/024* (2025.01); *H10F 39/8023* (2025.01); *H10F 39/805* (2025.01); *H10F 39/8053* (2025.01)

(58) Field of Classification Search
CPC .. H10F 39/806; H10F 39/024; H10F 39/8053; H10F 39/8063
See application file for complete search history.

(56) References Cited

U.S. PATENT DOCUMENTS

| | | | |
|---|---|---|---|
| 7,202,896 B2 | 4/2007 | Wako et al. |
| 8,076,745 B2 | 12/2011 | Nishiwaki |
| 9,860,491 B2 | 1/2018 | Park et al. |
| 2006/0183265 A1 | 8/2006 | Oh et al. |

(Continued)

FOREIGN PATENT DOCUMENTS

| | | | |
|---|---|---|---|
| EP | 3 812 803 A1 | | 4/2021 |
| KR | 20070027108 A | * | 8/2005 |

(Continued)

OTHER PUBLICATIONS

European Search Report issued on Mar. 21, 2023 by the European Patent office for European Patent Application No. 22205229.2.

(Continued)

*Primary Examiner* — Davienne N Monbleau
*Assistant Examiner* — Heim Kirin Grewal
(74) *Attorney, Agent, or Firm* — Sughrue Mion, PLLC

(57) ABSTRACT

An image sensor includes: a sensor substrate including a plurality of light sensing cells; a spacer layer which is transparent and arranged on an upper side of the sensor substrate; and a color separation lens array arranged on an upper side of the spacer layer. The color separation lens array includes: a first lens layer which includes a first nanopost having a sub-wavelength shape dimension and a first peripheral material provided around the first nanopost; and a first chemical mechanical polishing (CMP) stop layer which is provided on an entire upper surface of the first lens layer except for an upper surface of the first nanopost.

20 Claims, 31 Drawing Sheets

(56) References Cited

U.S. PATENT DOCUMENTS

| | | | | |
|---|---|---|---|---|
| 2008/0303107 | A1* | 12/2008 | Minamio | H10F 39/026 257/E31.127 |
| 2009/0250594 | A1 | 10/2009 | Tanaka et al. | |
| 2010/0006969 | A1* | 1/2010 | Park | H10F 39/8053 257/446 |
| 2015/0270308 | A1* | 9/2015 | Choi | H10F 39/024 257/292 |
| 2016/0006995 | A1 | 1/2016 | Yun et al. | |
| 2017/0090206 | A1* | 3/2017 | Kim | H10F 39/806 |
| 2018/0224574 | A1* | 8/2018 | Lee | C23C 14/5806 |
| 2019/0189664 | A1* | 6/2019 | Benahmed | G01N 15/1456 |
| 2020/0098814 | A1 | 3/2020 | Yang | |
| 2021/0124179 | A1 | 4/2021 | Yun et al. | |
| 2021/0125301 | A1* | 4/2021 | Park | G06T 1/0007 |
| 2021/0126030 | A1 | 4/2021 | Yun et al. | |
| 2021/0126035 | A1 | 4/2021 | Roh et al. | |
| 2022/0137267 | A1 | 5/2022 | Park et al. | |
| 2022/0137424 | A1 | 5/2022 | Lee et al. | |

FOREIGN PATENT DOCUMENTS

| | | | |
|---|---|---|---|
| KR | 10-2007-0027108 | A | 3/2007 |
| KR | 10-0807214 | B1 | 3/2008 |
| KR | 10-2016-0004641 | A | 1/2016 |
| KR | 10-2017-0038524 | A | 4/2017 |
| KR | 10-2018-0090613 | A | 8/2018 |
| KR | 10-2021-0048401 | A | 5/2021 |

OTHER PUBLICATIONS

Communication issued on Apr. 17, 2023 by the Korean Intellectual Property Office for Korean Patent Application No. 10-2021-0159780.

* cited by examiner

130

| | | | | | |
|---|---|---|---|---|---|
| 131 | 132 | 131 | 132 | 131 | 132 |
| 133 | 134 | 133 | 134 | 133 | 134 |
| 131 | 132 | 131 | 132 | 131 | 132 |
| 133 | 134 | 133 | 134 | 133 | 134 |
| 131 | 132 | 131 | 132 | 131 | 132 |
| 133 | 134 | 133 | 134 | 133 | 134 |

110

| | | | | | |
|---|---|---|---|---|---|
| 111 | 112 | 111 | 112 | 111 | 112 |
| 113 | 114 | 113 | 114 | 113 | 114 |
| 111 | 112 | 111 | 112 | 111 | 112 |
| 113 | 114 | 113 | 114 | 113 | 114 |
| 111 | 112 | 111 | 112 | 111 | 112 |
| 113 | 114 | 113 | 114 | 113 | 114 |

IMAGE SENSOR, METHOD OF MANUFACTURING IMAGE SENSOR, AND ELECTRONIC DEVICE INCLUDING IMAGE SENSOR

CROSS-REFERENCE TO RELATED APPLICATION

This application is based on and claims priority under 35 U.S.C. § 119 to Korean Patent Application No. 10-2021-0159780, filed on Nov. 18, 2021, in the Korean Intellectual Property Office, the disclosure of which is incorporated by reference herein in its entirety.

BACKGROUND

1. Field

The disclosure relates to an image sensor, a method of manufacturing the image sensor, and an electronic device including the image sensor.

2. Description of the Related Art

In general, image sensors sense the color of incident light using color filters. However, color filters absorb all colors except for a certain color, and thus the light use efficiency of color filters may be low. For example, an RGB color filter transmits only ⅓ of incident light and absorbs the remaining ⅔ of the incident light, and thus the light use efficiency of the color filter is only about 33%. Accordingly, most of the light loss in image sensors occurs in color filters. Therefore, research is being conducted to develop methods of separating colors and distributing the colors to pixels of an image sensor by using nanostructures instead of using color filters. In such an image sensor using nanostructures, it is necessary that dimensions suitable for color separation are well implemented through manufacturing processes.

SUMMARY

Provided are image sensors including color separation lens arrays capable of splitting incident light according to the wavelength of the incident light and then condensing the incident light, and methods of manufacturing the image sensors.

Additional aspects will be set forth in part in the description which follows and, in part, will be apparent from the description, or may be learned by practice of the presented embodiments of the disclosure.

According to an aspect of the disclosure, there is provided an image sensor including: a sensor substrate including a plurality of light sensing cells; a spacer layer provided on the sensor substrate, the spacer layer being transparent; and a color separation lens array provided on the spacer layer, wherein the color separation lens array includes: a first lens layer including a first nanopost having a sub-wavelength shape dimension and a first peripheral material provided around the first nanopost; and a first chemical mechanical polishing (CMP) stop layer provided on an entire upper surface of the first peripheral material, wherein the first CMP stop layer is not provided on an upper surface of the first nanopost.

The color separation lens array may further include: a second lens layer provided on the first lens layer, the second lens layer including a second nanopost having a sub-wavelength shape dimension and a second peripheral material provided around the second nanopost; and a second CMP stop layer provided on an entire upper surface of the second peripheral material, wherein the second CMP stop layer is not provided on an upper surface of the second nanopost.

The first nanopost may be in direct contact with the second nanopost.

A separation distance between a center axis of the first nanopost and a center axis of the second nanopost may be about zero or more.

The separation distance may increase as a position of the first nanopost and the second nanopost from a center of the image sensor increases.

The first CMP stop layer or the second CMP stop layer may include Al2O3, SiN, or HfO2.

The first CMP stop layer or the second CMP stop layer may have a thickness of about 5 nm to about 50 nm.

The image sensor may further include an etch stop layer arranged between the spacer layer and the first lens layer.

The image sensor may further include a protective layer arranged on the color separation lens array.

The protective layer may be an anti-reflection layer.

The color separation lens array may be configured to separate a first wavelength and a second wavelength from incident light and condense the first wavelength and the second wavelength respectively on a first pixel and a second pixel of the plurality of light sensing cells.

The image sensor may further include a color filter array provided between the spacer layer and the sensor substrate.

According to another aspect of the disclosure, there is provided an electronic device including the image sensor, which is configured to convert an optical image into an electrical signal and a processor configured to control an operation of the image sensor, and store and output the electric signal generated by the image sensor.

According to another aspect of the disclosure, there is provided a method of manufacturing an image sensor, the method including: forming a spacer layer on a sensor substrate, the sensor substrate including a plurality of light sensing cells; forming a first dielectric layer on the spacer layer; forming a first chemical mechanical polishing (CMP) stop layer on the first dielectric layer; forming a first engraved pattern by patterning an opening in the first dielectric layer and the first CMP stop layer; forming a first nanopattern layer by filling the first engraved pattern with a first dielectric material having a first refractive index different from a second refractive index of the first dielectric layer, wherein the first dielectric material extends onto an upper surface of the first CMP stop layer; and forming a first lens layer by removing a portion of the first nanopattern layer formed on the upper surface of the first CMP stop layer.

The method may further include forming an etch stop layer on the spacer layer prior to the forming of the first dielectric layer on the spacer layer.

The method may further include forming a protective layer on the first lens layer.

The method may further include forming a second lens layer on the first lens layer.

The forming of the second lens layer may include: forming a second dielectric layer on the first lens layer; forming a second CMP stop layer on the second dielectric layer; forming a second engraved pattern by forming an opening in the second dielectric layer and the second CMP stop layer; forming a second nanopattern layer by filling the second engraved pattern with a second dielectric material having a third refractive index different from a fourth refractive index of the second dielectric layer, wherein the second dielectric material extends onto an upper surface of the second CMP stop layer; and removing a portion of the second nanopattern layer formed on the upper surface of the second CMP stop layer.

A separation distance between a center axis of the second engraved pattern and a center axis of the first engraved pattern may be zero or more.

The method may further include forming a protective layer on the second lens layer.

The first CMP stop layer or the second CMP stop layer may include Al2O3, SiN, or HfO2.

The first CMP stop layer or the second CMP stop layer may have a thickness of about 5 nm to about 50 nm.

A separation distance between a center axis of the second engraved pattern and a center axis of the first engraved pattern may be zero.

A separation distance between a center axis of the second engraved pattern and a center axis of the first engraved pattern may be non-zero.

A separation distance between a center axis of the second engraved pattern and a center axis of the first engraved pattern may vary based on an position of the first engraved pattern and the second engraved pattern in the image sensor.

According to an aspect of the disclosure, there is provided a color separation lens array of an image sensor, the color separation lens array including: a first lens layer including: a first nanopost having a dimension configured to split light of a first wavelength band, and a first peripheral material provided adjacent to the first nanopost; and a first chemical mechanical polishing (CMP) stop layer provided on an upper surface of the first peripheral material, wherein the first CMP stop layer is not provided on an upper surface of the first nanopost.

The color separation lens array may include a second lens layer provided on the first lens layer, the second lens layer including: a second nanopost having a dimension configured to split light of a second wavelength band, and a second peripheral material provided adjacent to the second nanopost; and a second CMP stop layer provided on an upper surface of the second peripheral material, wherein the second CMP stop layer is not provided on an upper surface of the second nanopost.

A first portion of the second lens layer is directly provided on the first CMP stop layer and a second portion of the second lens layer may be directly provided on the first nanopost.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
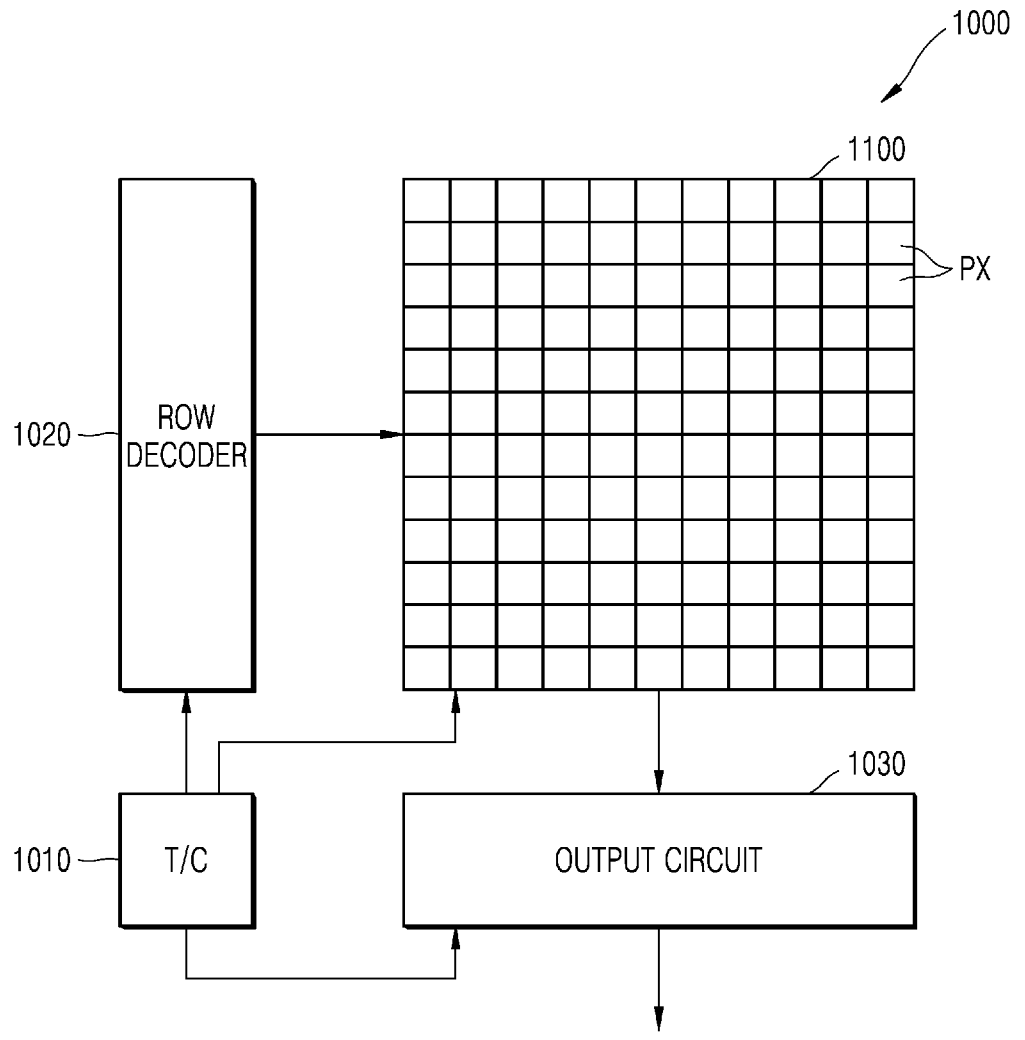
FIG. 1 is a block diagram illustrating an image sensor according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described with reference to the accompanying drawings. The embodiments described herein are for illustrative purposes only, and various modifications may be made therein. In the drawings, like reference numerals refer to like elements, and the sizes of elements may be exaggerated for clarity of illustration.

In the following description, when an element is referred to as being "above" or "on" another element, it may be directly on the other element while making contact with the other element or may be above the other element without making contact with the other element.

Although the terms "first" and "second" are used to describe various elements, these terms are only used to distinguish one element from another element. These terms do not limit elements to having different materials or structures.

The terms of a singular form may include plural forms unless otherwise mentioned. It will be further understood that the terms "comprises" and/or "comprising" used herein specify the presence of stated features or elements, but do not preclude the presence or addition of one or more other features or elements.

In the present disclosure, terms such as "unit" or "module" may be used to denote a unit that has at least one function or operation and is implemented with hardware, software, or a combination of hardware and software.

An element referred to with the definite article or a demonstrative determiner may be construed as the element or the elements even though it has a singular form.

Operations of a method may be performed in appropriate order unless explicitly described in terms of order or described to the contrary. In addition, examples or exemplary terms (for example, "such as" and "etc.") are used for the purpose of description and are not intended to limit the scope of the inventive concept unless defined by the claims.

FIG. 1 is a block diagram illustrating an image sensor 1000 according to an example embodiment.

Referring to FIG. 1, the image sensor 1000 may include a pixel array 1100, a timing controller 1010, a row decoder 1020, and an output circuit 1030. The image sensor 1000 may be a charge coupled device (CCD) image sensor or a complementary metal oxide semiconductor (CMOS) image sensor.

The pixel array 1100 includes pixels, which are two-dimensionally arranged in rows and columns. The row decoder 1020 selects one row of the pixel array 1100 in response to a row address signal output from the timing controller 1010. Light sensing signals from a plurality of pixels arranged in the selected row are output through the output circuit 1030 according to the columns. To this end, the output circuit 1030 may include a column decoder and an analog-to-digital converter (ADC). For example, the output circuit 1030 may include a plurality of ADCs arranged between the column decoder and the pixel array 1100 respectively for the columns, or may include one ADC arranged at an output terminal of the column decoder. The timing controller 1010, the row decoder 1020, and the output circuit 1030 may be provided as a single chip or as separate chips. A processor for processing image signals output through the output circuit 1030 may be included in a single chip together with the timing controller 1010, the row decoder 1020, and the output circuit 1030.

The pixel array 1100 may include the pixels for sensing light having different wavelengths. The pixels may be arranged in various manners.

Figure 2A:
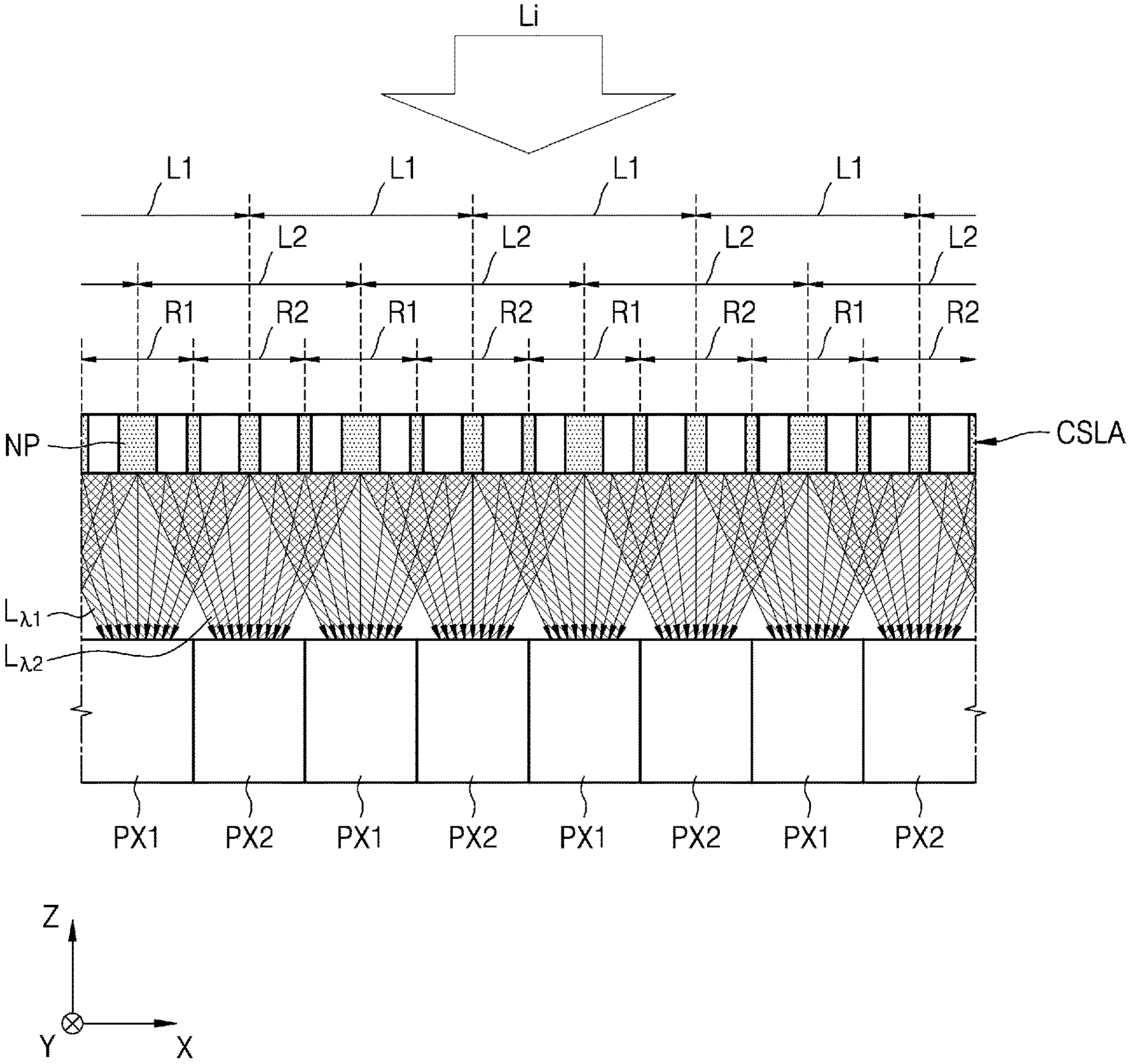
FIGS. 2A and 2B are conceptual views schematically illustrating a structure and an operation of a color separation lens array provided in the image sensor according to an example embodiment.
Figure 2B:
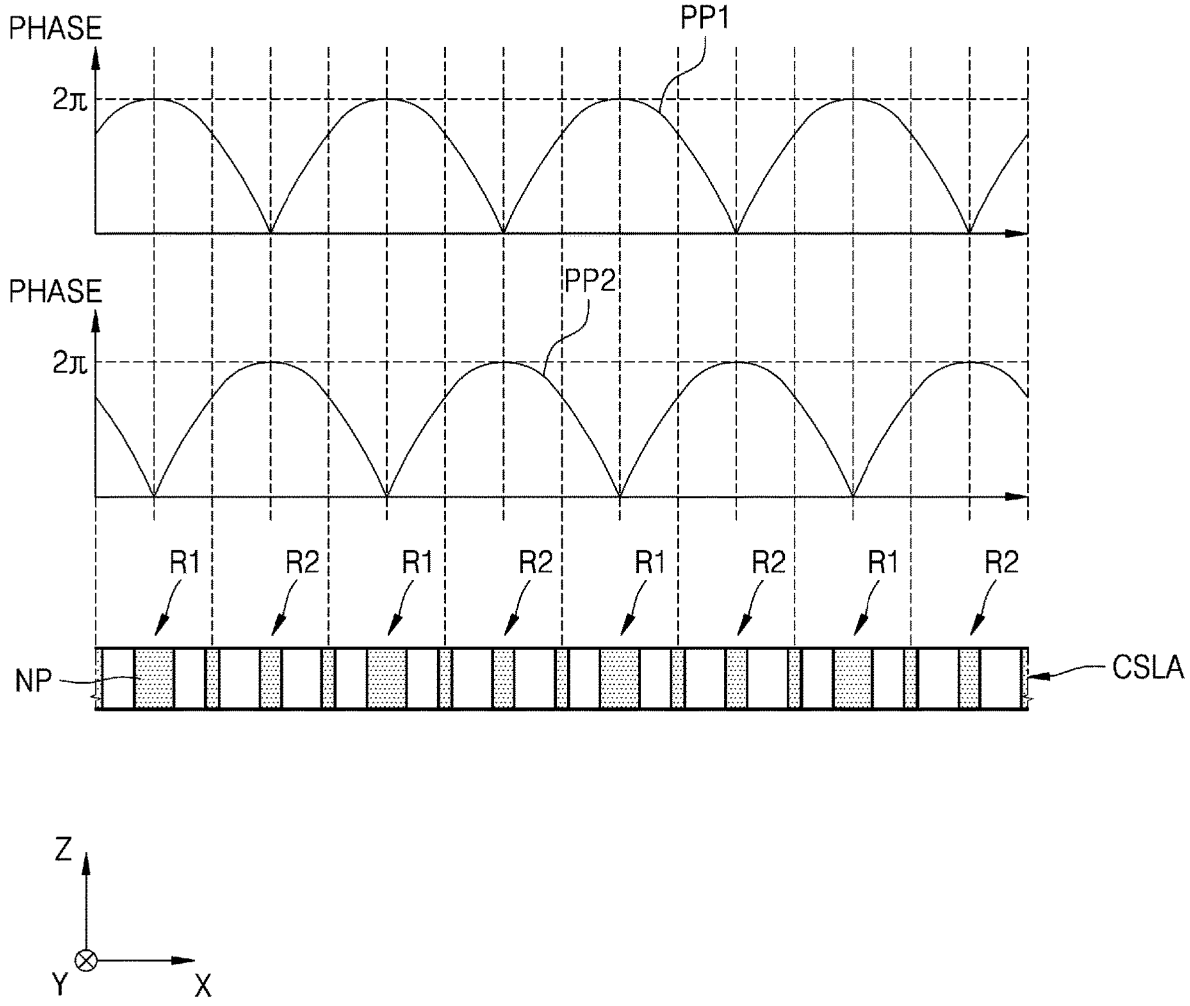

FIGS. 2A and 2B are conceptual views schematically illustrating a structure and an operation of a color separation lens array CSLA provided in the image sensor 1000 according to an example embodiment.

Referring to FIG. 2A, the color separation lens array CSLA may include a plurality of nanoposts NP configured to vary the phase of incident light Li differently according to incident positions. The color separation lens array CSLA may be partitioned in various manners. For example, the color separation lens array CSLA may be partitioned into: a first pixel-corresponding region R1 that corresponds to a first pixel PX1 on which a first wavelength λ1 of incident light Li is condensed; and a second pixel-corresponding region R2 that corresponds to a second pixel PX2 on which a second wavelength λ2 of the incident light Li is condensed. The first and second pixel-corresponding regions R1 and R2 may each include one or more nanoposts NP and may respectively face the first and second pixels PX1 and PX2. In another example, the color separation lens array CSLA may be partitioned into: a first wavelength condensing region L1 configured to condense the first wavelength λ1 of incident light Li on the first pixel PX1; and a second wavelength condensing region L2 configured to condense the second wavelength λ2 of the incident light Li on the second pixel PX2. The first wavelength condensing region L1 and the second wavelength condensing region L2 may partially overlap each other.

The color separation lens array CSLA may impart different phase profiles respectively to the first and second wavelengths $L_{\lambda 1}$ and $L_{\lambda 2}$ of incident light Li and may condense the first and second wavelengths $L_{\lambda 1}$ and $L_{\lambda 2}$ respectively on the first and second pixels PX1 and PX2.

For example, referring to FIG. 2B, immediately after passing through the color separation lens array CSLA, that is, when reaching a lower surface of the color separation lens array CSLA, light having the first wavelength λ1 may have a first phase profile PP1, and light having the second wavelength λ2 may have a second phase profile PP2, such that light having the first wavelength λ1 may be condensed on the first pixel PX1, and light having the second wavelength λ2 may be condensed on the second pixel PX2. For example, light having the first wavelength λ1 and passing through the color separation lens array CSLA may have a phase profile, which is highest at the center of the first pixel-corresponding region R1 and decreases in a direction away from the center of the first pixel-corresponding region R1, that is, in a direction toward the center of the second pixel-corresponding region R2. The phase profile is similar to the phase profile of light, which is condensed on a point through a convex lens such as a microlens having a convex center and arranged in the first wavelength condensing region L1, and light having the first wavelength λ1 may be condensed on the first pixel PX1. In addition, light having the second wavelength λ2 and passing through the color separation lens array CSLA may have a phase profile, which is highest at the center of the second pixel-corresponding region R2 and decreases in a direction away from the center of the second pixel-corresponding region R2, that is, in a direction toward the center of the first pixel-corresponding region R1, such that light having the second wavelength λ2 may be condensed to the second pixel PX2.

Because the refractive index of a material varies depending on the wavelength of light incident on the material, the color separation lens array CSLA may imparts different phase profiles to the first and second wavelengths $L_{\lambda 1}$, and $L_{\lambda 2}$. In other words, even the same material has different refractive indexes for different wavelengths of light incident thereon, and different wavelengths of light have different phase delays after passing through the same material, such that different phase profiles may be formed for different wavelengths. For example, the refractive index of the first pixel-corresponding region R1 for the first wavelength λ1 may be different from the refractive index of the first pixel-corresponding region R1 for the second wavelength λ2, and the phase delay of the first wavelength λ1 after the first wavelength λ1 passes through the first pixel-corresponding region R1 may be different from the phase delay of the second wavelength λ2 after the second wavelength λ2 passes through the first pixel-corresponding region R1. Therefore, the color separation lens array CSLA may be designed by considering these characteristics of light to provide different phase profiles for the first and second wavelengths $L_{\lambda 1}$ and $L_{\lambda 2}$.

The color separation lens array CSLA may include nanoposts NP arranged according to particular rules such that the first and second wavelengths $L_{\lambda 1}$ and $L_{\lambda 2}$ may respectively have the first and second phase profiles PP1 and PP2. Here, the rules may be applied to parameters such as the shape, size (width or height), spacing, and arrangement of the nanoposts NP, and the parameters may be determined according to phase profiles to be realized using the color separation lens array CSLA.

A rule for arranging nanoposts NP in the first pixel-corresponding region R1 may be different from a rule for arranging nanoposts NP in the second pixel-corresponding region R2. In other words, the size, shape, spacing, and/or arrangement of nanoposts NP in the first pixel-corresponding region R1 may be different from the size, shape, spacing, and/or arrangement of nanoposts NP in the second pixel-corresponding region R2.

The nanoposts NP may have sub-wavelength shape dimensions. Here, the sub-wavelength refers to a wavelength less than the wavelength band of light to be split. For example, the nanoposts NP may have a dimension smaller than a shorter one of the first wavelength λ1 and the second wavelength λ2. The nanoposts NP may have a cylindrical shape having a sub-wavelength cross-sectional diameter. However, the shape of the nanoposts NP is not limited thereto. When incident light Li is visible light, the cross-sectional diameter of the nanoposts NP may be less than, for example, about 400 nm, about 300 nm, or about 200 nm. In addition, the height of the nanoposts NP may range from about 500 nm to about 1500 nm and may be greater than the cross-sectional diameter of the nanoposts NP. According to another example embodiment, the nanoposts NP may include nanoposts each having two or more posts stacked in a height direction (Z direction).

The nanoposts NP may include a material having a higher refractive index than the refractive index of a surrounding material. For example, the nanoposts NP may include c-Si, p-Si, a-Si, a Group III-V compound semiconductor (such as GaP, GaN, GaAs, or the like), SiC, $TiO_2$, SiN, and/or a combination thereof. The nanoposts NP having a refractive index different from the refractive index of the surrounding material may vary the phase of light passing through the nanoposts NP. This may be due to a phase delay caused by sub-wavelength shape dimensions of the nanoposts NP, and the degree of such a phase delay may be determined by the shape dimensions, arrangement, and the like of the nanoposts NP. The material surrounding the nanoposts NP may include a dielectric material having a refractive index less than the refractive index of the nanoposts NP. For example, the surrounding material may include $SiO_2$ or air. However, this is merely an example, and in another example, the material of the nanoposts NP and the surrounding material may be determined such that the nanoposts NP may have a refractive index less than the refractive index of the surrounding material.

The regions into which the color separation lens array CSLA is partitioned, and the shapes and arrangement of the nanoposts NP may be determined to form a phase profile allowing incident light to be split and condensed on a plurality of pixels such as the first and second pixels PX1 and PX2 according to the wavelength of the incident light. This wavelength separation may include, but is not limited to, color separation in a visible light band, and a wavelength band of which wavelengths are to be separated may include a wavelength band from visible light to infrared light or various other wavelength bands. The first wavelength λ1 and the second wavelength λ2 may be included in an infrared-to-visible wavelength band, but are not limited thereto. For example, the first wavelength λ1 and the second wavelength λ2 may be included in various wavelength bands according to the arrangement rules of the nanoposts NP. In addition, although two wavelengths are separated from each other and condensed in the example described above, incident light may be split in three directions according to wavelengths of the incident light in another example.

In addition, the nanoposts NP of the color separation lens array CSLA are arranged in a single layer in the example described above. In another example, however, the color separation lens array CSLA may have a stacked structure in which nanoposts NP are arranged in a plurality of layers.

In addition, as described above, the wavelength separation by the color separation lens array CSLA is implemented by the shapes and the refractive index distributions of the nanoposts NP and the surrounding material, and thus the efficiency of wavelength separation may be low when parameters for forming desired refractive index distributions are not properly implemented due to process errors. According to an example embodiment, however, the image sensor 1000 may be manufactured by a method capable of reducing dispersion in processes, and thus the efficiency of color separation may be increased.

Figure 3:
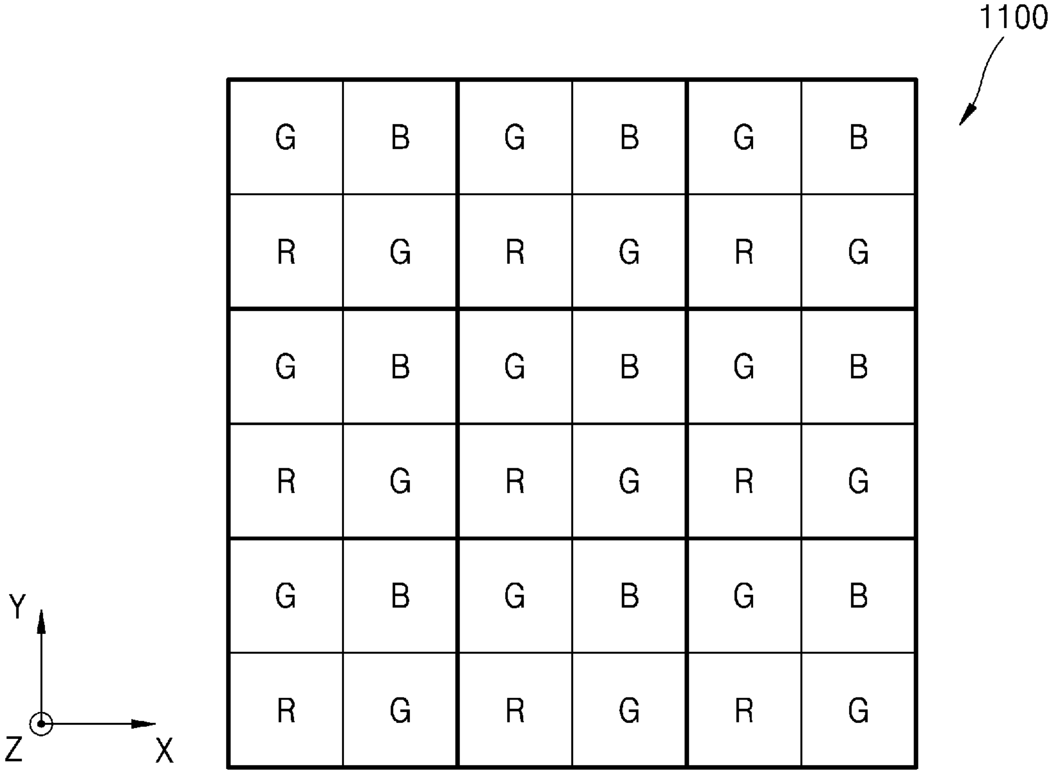
FIG. 3 is a plan view illustrating a color arrangement by a pixel array of the image sensor according to an example embodiment.

FIG. 3 is a plan view illustrating a color arrangement by the pixel array 1100 of the image sensor 1000 according to an example embodiment.

The pixel arrangement of the image sensor 1000 is a Bayer pattern arrangement generally employed in image sensors. As shown in FIG. 3, one unit pattern includes four regions, that is, first to fourth quadrants, and the first to fourth quadrants may respectively be a blue pixel B, a green pixel G, a red pixel R, and a green pixel G. The unit pattern is two-dimensionally repeated in a first direction (X direction) and a second direction (Y direction). In other words, in each unit pattern of a 2×2 array type, two green pixels G are arranged in a diagonal direction, and one blue pixel B and one red pixel R are arranged in the other diagonal direction.

In the pixel arrangement, a first row in which a plurality of green pixels G and a plurality of blue pixels B are alternately arranged in the first direction, a second row in which a plurality of red pixels R and a plurality of green pixels G are alternately arranged in the first direction, and the first and second rows are repeated in the second direction.

The pixel array 1100 of the image sensor 1000 may include the color separation lens array CSLA configured to condense colors of light on corresponding pixels to realize the color arrangement. That is, the regions of the color separation lens array CSLA, and the shape and arrangement of nanoposts NP in the color separation lens array CSLA may be set such that the wavelengths separated by the color separation lens array CSLA as described in FIGS. 2A and 2B may a red wavelength, a green wavelength, and a blue wavelength.

The color arrangement shown in FIG. 3 is merely a non-limiting example. Other examples of the color arrangement include a CYGM arrangement in which a magenta pixel M, a cyan pixel C, a yellow pixel Y, and a green pixel G form one unit pattern, and an RGBW arrangement in which a green pixel G, a red pixel R, a blue pixel B, and a white pixel W form one unit pattern In addition, the unit pattern may be provided in the form of a 3×2 array, and the pixels of the pixel array 1100 may be arranged in various other manners according to the color characteristics of the image sensor 1000. In the following description, an example in which the pixel array 1100 of the image sensor 1000 has the Bayer pattern arrangement is described, but the operational principle of the pixel array 1100 of the image sensor 1000 may be applied to pixel arrangements other than the Bayer pattern arrangement.

Figure 4A:
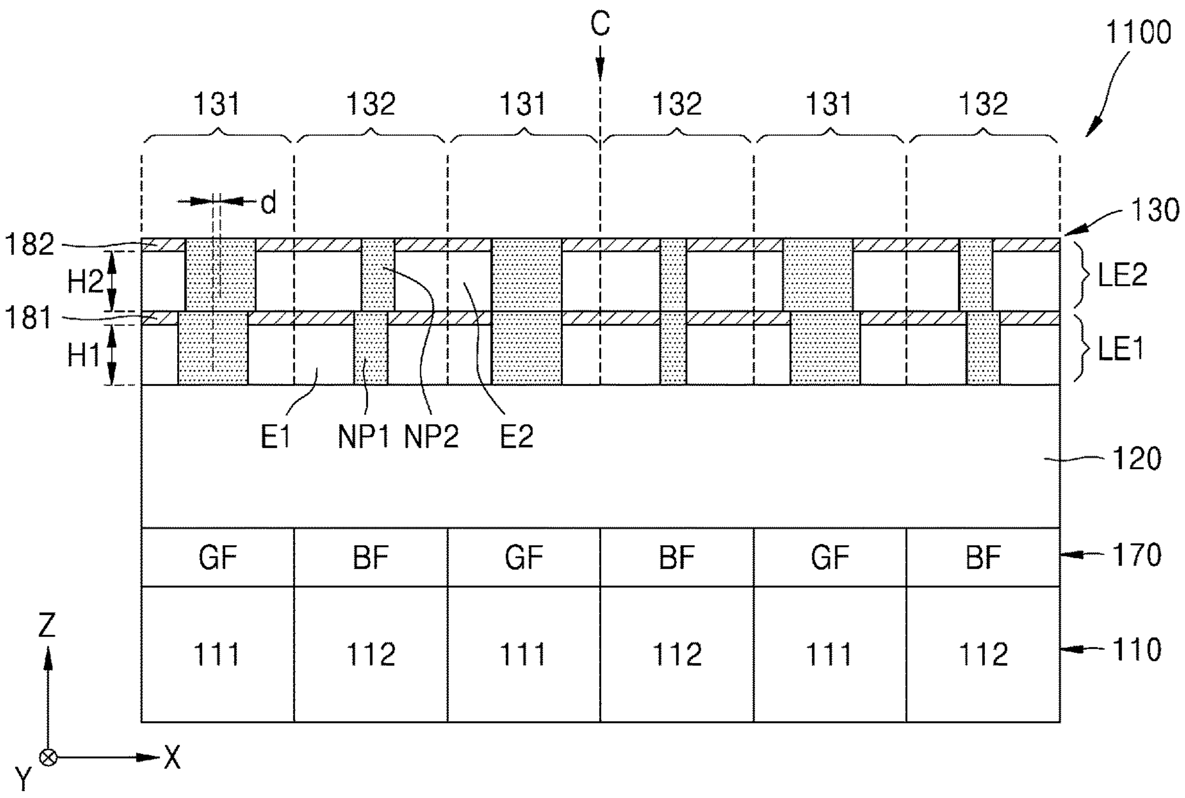
FIGS. 4A and 4B are cross-sectional views illustrating the pixel array of the image sensor according to embodiments.
Figure 4B:
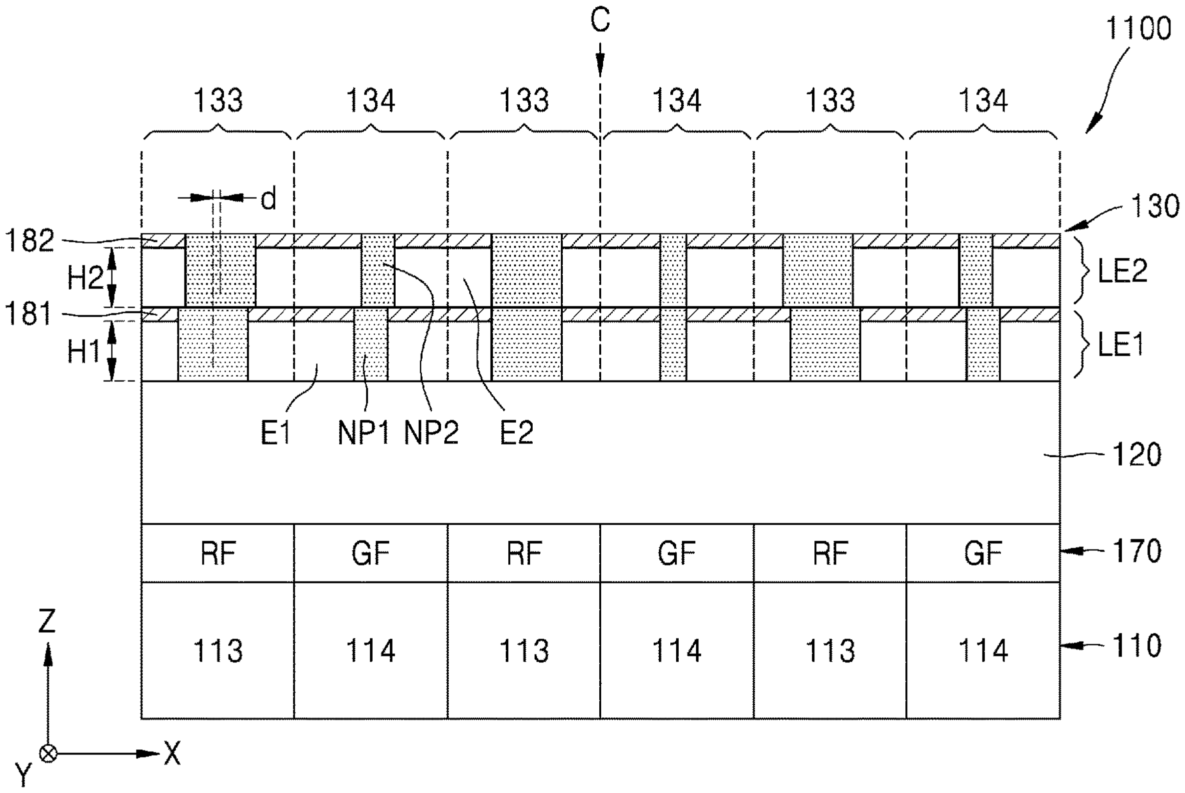
Figure 5A:
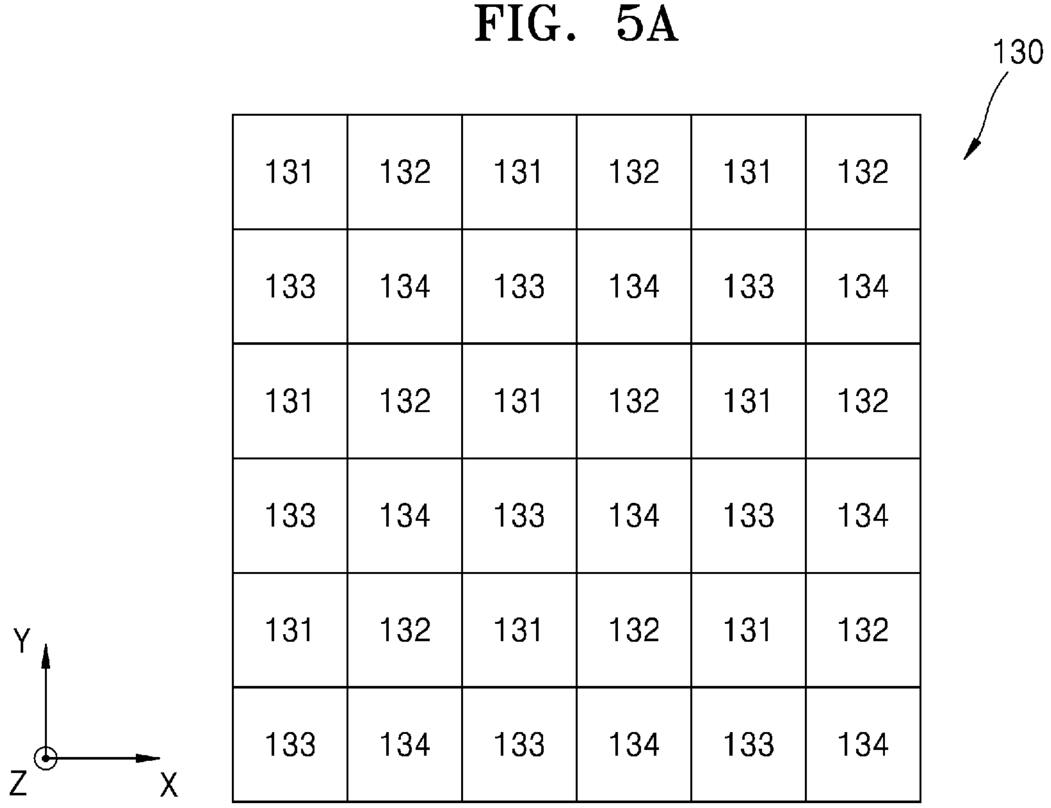
FIG. 5A is a plan view illustrating an arrangement of pixel-corresponding regions of the color separation lens array provided in the image sensor according to an example embodiment.
Figure 5B:
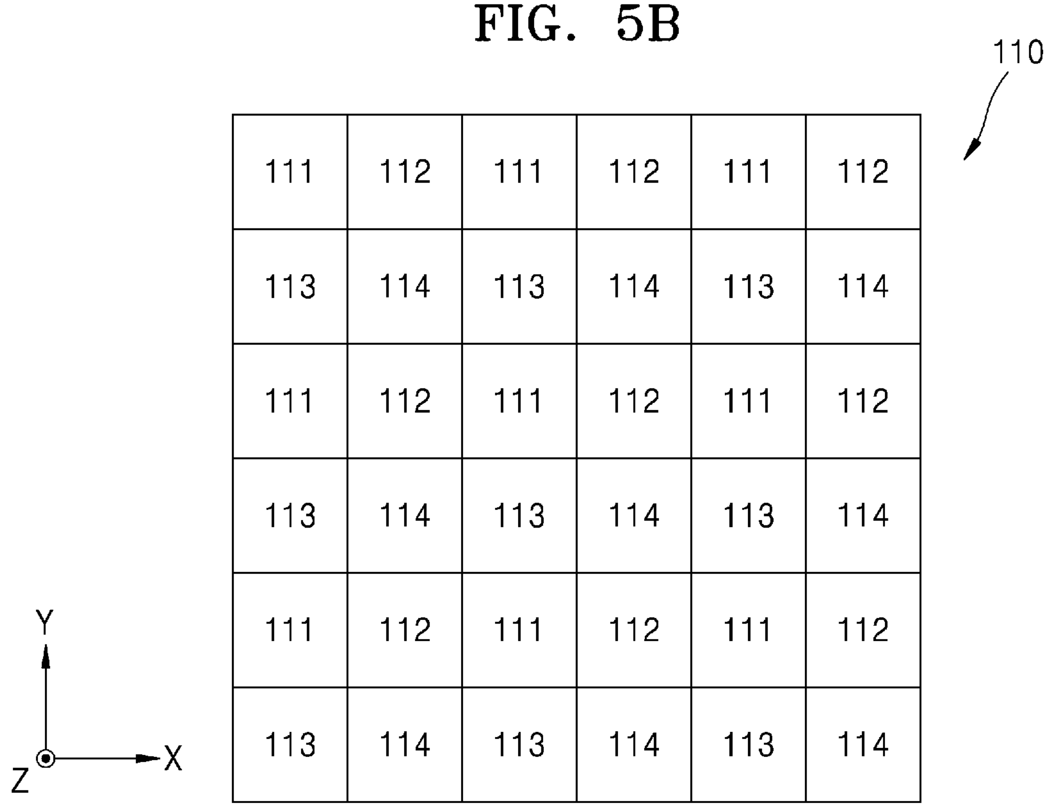
FIG. 5B is a plan view illustrating a pixel arrangement of a sensor substrate provided in the image sensor according to an example embodiment.

FIGS. 4A and 4B are cross-sectional views illustrating the pixel array 1100 of the image sensor 1000 shown in FIG. 1. FIG. 5A is a plan view illustrating an arrangement of pixel-corresponding regions of a color separation lens array 130 provided in the pixel array 1100, and FIG. 5B is a plan view illustrating a pixel arrangement of a sensor substrate 110 provided in the pixel array 1100.

Referring to FIGS. 4A and 4B, the pixel array 1100 of the image sensor 1000 includes the sensor substrate 110 including a plurality of pixels 111, 112, 113, and 114 for sensing light and the color separation lens array 130 arranged on the sensor substrate 110.

A transparent spacer layer 120 may be arranged between the sensor substrate 110 and the color separation lens array 130. The spacer layer 120 supports the color separation lens array 130 and may have a thickness selected to satisfy a required distance between the sensor substrate 110 and the color separation lens array 130.

A color filter array 170 may be arranged between the sensor substrate 110 and the spacer layer 120. The color filter array 170 may include a red filter RF, a green filter GF, and a blue filter BF, and may be arranged in a shape corresponding to the color arrangement illustrated in FIG. 3. According to an example embodiment, the color separation lens array 130 may separate colors, and the color filter array 170, which is additionally provided, may improve color purity by compensating for some errors that may occur during color separation by the color separation lens array 130. The color filter array 170 may be omitted.

The color separation lens array 130 has a form in which a plurality of nanoposts are arranged in a plurality of layers. The color separation lens array 130 includes a first lens layer LE1 and a second lens layer LE2. The first lens layer LE1 includes a plurality of first nanoposts NP1 and a first peripheral material E1 arranged around the first nanoposts NP1, and the second lens layer LE2 includes a plurality of second nanoposts NP2 and a second peripheral material E2 arranged around the second nanoposts NP2. The first peripheral material E1 may be arranged to surround lateral surfaces of the first nanoposts NP1, and the second peripheral material E2 may be arranged to surround lateral surfaces of the second nanoposts NP2. The first nanoposts NP1 may include a material having a higher refractive index than the first peripheral material E1, and the second nanoposts NP2 may include a material having a higher refractive index than the second peripheral material E2. However, this is merely an example, and the refractive index relationship may be reversed.

A high refractive index material included in the first nanoposts NP1, the second nanoposts NP2, the first peripheral material E1, or the second peripheral material E2 may include at least one selected from the group consisting of c-Si, p-Si, a-Si, a Group III-V compound semiconductor (GaAs, GaP, GaN, GaAs, or the like), SiC, $TiO_2$, and SiN. A low refractive index material included in the first nanoposts NP1, the second nanoposts NP2, the first peripheral material E1, or the second peripheral material E2 may include a polymer material such as SU-8 or polymethylmethacrylate (PMMA); $SiO_2$; spin-on-glass (SOG); or air.

The first nanoposts NP1 and the second nanoposts NP2 may each have a post shape having a height in the Z direction, and the post shape may be a cylindrical, elliptical, or polygonal shape, or may have a symmetrical or asymmetrical cross-sectional shape. Although the first nanoposts NP1 and the second nanoposts NP2 are illustrated as each having a constant width in a direction perpendicular to the height direction, that is, having a rectangular cross-section parallel to the height direction, this is merely an example. As such, according to another example embodiment, the first nanoposts NP1 and the second nanoposts NP2 may each have a non-constant width in a direction perpendicular to the height direction. For example, the first nanoposts NP1 and the second nanoposts NP2 may each have an inverted trapezoidal cross-section parallel to the height direction.

The height of each of the first nanoposts NP1 and the second nanoposts NP2 may be several times the wavelength or a sub-wavelength of incident light. For example, the height of each of the first nanoposts NP1 and the second nanoposts NP2 may be equal to or greater than half the center wavelength of a wavelength band to be split by the color separation lens array 130, but may be equal to or less than five, times the center wavelength of the wavelength band to be split by the color separation lens array 130. According to another example embodiment, the height of each of the first nanoposts NP1 and the second nanoposts NP2 may be equal to or less than four times the center wavelength of the wavelength band to be split by the color separation lens array 130. According to another example embodiment, the height of each of the first nanoposts NP1 and the second nanoposts NP2 may be equal to or less than three times the center wavelength of the wavelength band to be split by the color separation lens array 130. The height of each of the first nanoposts NP1 and the second nanoposts NP2 may be, for example, within a range of about 500 nm to about 1500 nm.

The first nanoposts NP1 and the second nanoposts NP2 arranged adjacent to each other and corresponding to each other in the first lens layer LE1 and the second lens layer LE2 may have unaligned center axes. The distance (d) between two center axes of each pair of the first and second nanoposts NP1 and NP2 may be zero or more. For example, some of the first and second nanoposts NP1 and NP2 may have aligned center axes, and the others may have unaligned center axes. The distance (d) between the two center axes of each pair of the first and second nanoposts NP1 and NP2 may increase in a direction away from the center C of the pixel array 1100. The center axes of pairs of the first and second first and second nanoposts NP1 and NP2 may be apart from each other in opposite directions on both sides of the center C. On the right side of the center C, the second nanoposts NP2 may be shifted toward the center C from the first nanoposts NP1, that is, the second nanoposts NP2 may be shifted to the left. On the left side of the center C, the second nanoposts NP2 may be shifted toward the center C from the first nanoposts NP1, that is, the second nanoposts NP2 may be shifted to the right. The first nanoposts NP1 and the second nanoposts NP2 are arranged as described above because the incident angle of chief rays incident on the color separation lens array 130 varies according to the position on the color separation lens array 130. The amount of sift may be proportional to a distance from the center C of the color separation lens array 130. In other words, the distance (d) between the center axes of the first and second nanoposts NP1 and NP2 which correspond to each other in two layers may increase in a direction away from the center C of the color separation lens array 130.

According to an example embodiment, a first chemical mechanical polishing (CMP) stop layer 181 is formed on the entire surface between the first lens layer LE1 and the second lens layer LE2 except for the upper surfaces of the first nanoposts NP1. For example, the first CMP stop layer 181 layer is formed on an upper surface of the first peripheral material E1, but the first CMP stop layer 181 layer is not formed on an upper surface of the first nanoposts NP1. That is, the first CMP stop layer 181 is not arranged on the upper surfaces of the first nanoposts NP1 but is in direct contact with only the upper surface of the first peripheral material E1. The upper surfaces of the first CMP stop layer 181 and the first nanoposts NP1 may be connected to each other and may be flat to form a flat surface. In addition, a second CMP stop layer 182 is formed on the entire upper surface of the second lens layer LE2 except for the upper surfaces of the second nanoposts NP2. That is, the second CMP stop layer 182 is not arranged on the upper surfaces of the second nanoposts NP2 but is in direct contact with only the upper surface of the second peripheral material E2. The upper surfaces of the second CMP stop layer 182 and the second nanoposts NP2 may be connected to each other and may be flat to form a flat surface.

The first CMP stop layer 181 and the second CMP stop layer 182 are formed so that during manufacturing processes, the first lens layer LE1 and the second lens layer LE2 may be formed to have intended heights H1 and H2. For example, a process of forming an engraved pattern in a low refractive index material layer, filling the engraved pattern with a high refractive index material, and then planarizing the materials may be used to form a pattern including the high refractive index material and the low refractive index material, and in this case, process dispersion may occur during CMP in the process. In addition, it has been experimentally confirmed that the greater the amount removed by CMP, the greater the dispersion. In a manufacturing method designed to reduce such dispersion according to an example embodiment, the first CMP stop layer 181 and the second CMP stop layer 182 are respectively formed in processes of forming the first lens layer LE1 and the second lens layer LE2. This will be described later when manufacturing methods are described.

As described above, the first CMP stop layer 181 is provided between the first lens layer LE1 and the second lens layer LE2 except for the upper surfaces of the first nanoposts NP1, and thus the first nanoposts NP1 and the second nanoposts NP2, which correspond to each other at lower and upper positions, may be directly connected to each other. According to a manufacturing method different from manufacturing methods of embodiments, the first nanoposts NP1 may be separated from the second nanoposts NP2 by an etch stop layer. Compared with this structure, the color separation lens array 130 may easily form an intended refractive index distribution.

The first CMP stop layer 181 and the second CMP stop layer 182 may include a material having lower CMP selectivity than materials of the first nanoposts NP1 and the second nanoposts NP2.

The materials and thicknesses of the first CMP stop layer 181 and the second CMP stop layer 182 may be determined by considering the materials and thicknesses of the first nanoposts NP1 and the second nanoposts NP2 and CMP selectivity relative to the materials of the first nanoposts NP1 and the second nanoposts NP2, and the like. The first CMP stop layer 181 and the second CMP stop layer 182 may include, for example, $Al_2O_3$, SiN, or $HfO_2$. The thicknesses of the first CMP stop layer 181 and the second CMP stop layer 182 may be determined by considering CMP process dispersion of a wafer during a CMP process for forming the first nanoposts NP1 and the second nanoposts NP2. The thicknesses of the first CMP stop layer 181 and the second CMP stop layer 182 may be, for example, within a range of about 5 nm to about 50 nm. This will be described again when manufacturing methods are described.

The sensor substrate 110 includes a plurality of light sensing cells capable of detecting light and convert the detected light into an electrical signal. The plurality of light sensing cells may include a first green pixel 111, a blue pixel 112, a red pixel 113, and a second green pixel 114. Referring to FIGS. 4A, 4B, and 5B, the first green pixel 111 and the blue pixel 112 may be alternately arranged in the first direction (X direction), and in a cross-section having a different position in the Y direction, the red pixel 113 and the second green pixel 114 may be alternately arranged.

The pixel arrangement of the sensor substrate 110 shown in FIG. 5B corresponds to the color arrangement (Bayer pattern) shown in FIG. 3. Hereinafter, the pixel arrangement of an image sensor and the pixel arrangement of a sensor substrate may be interchangeably used in the same sense. The pixel arrangement of the sensor substrate 110 is for sensing incident light by dividing the incident light into unit patterns such as Bayer patterns, and for example, the first and second green pixels 111 and 114 may sense green light, the blue pixel 112 may sense blue light, and the red pixel 113 may sense red light. According to another example embodiment, a separation film may be provided pixels to separate the pixels.

Referring to FIGS. 4A, 4B, 5A, and 5B, the color separation lens array 130 may be divided into four pixel-corresponding regions 131, 132, 133, and 134 (a first green pixel-corresponding region 131, a blue pixel-corresponding region 132, a red pixel-corresponding region 133, and a second green pixel-corresponding region 134). which respectively correspond to the first green pixel 111, the blue pixel 112, the red pixel 113, and the second green pixel 114 of the sensor substrate 110. The first green pixel-corresponding region 131 may correspond to the first green pixel 111 and may be arranged on an upper side of the first green pixel 111; the blue pixel-corresponding region 132 may correspond to the blue pixel 112 and may be arranged on an upper side of the blue pixel 112; the red pixel-corresponding region 133 may correspond to the red pixel 113 and be arranged on an upper side of the red pixel 111; and the second green pixel-corresponding region 134 may correspond to the second green pixel 114 and be arranged on an upper side of the second green pixel 114. That is, the pixel-corresponding regions 131, 132, 133, and 134 of the color separation lens array 130 may respectively face the first green pixel 111, the blue pixel 112, the red pixel 113, and the second green pixel 114 of the sensor substrate 110. The pixel-corresponding regions 131, 132, 133, and 134 may be two-dimensionally arranged in the first direction (X direction) and the second direction (Y direction) in a manner such that: the first green pixel-corresponding region 131 and the blue pixel-corresponding region 132 are alternately arranged in a first row; the red pixel-corresponding region 133 and the second green pixel-corresponding region 134 are alternately arranged in a second row; and the first and second rows are alternately arranged. Like the sensor substrate 110, the color separation lens array 130 also includes a plurality of unit patterns which are two-dimensionally arranged, and each of the unit pattern includes the pixel-corresponding regions 131, 132, 133, and 134 arranged in a 2×2 form.

In addition, the color separation lens array 130 may include regions conceptually similar to the regions described with reference to FIG. 2A. That is, the color separation lens array 130 may include a green light-condensing region for condensing green light, a blue light-condensing region for condensing blue light, and a red light-condensing region for condensing red light.

The color separation lens array 130 may include the first nanoposts NP1 and the second nanoposts NP2 of which the sizes, shapes, spacing, and/or arrangement are determined such that green light may be separated and condensed on the first and second green pixels 111 and 114, blue light may be separated and condensed on the blue pixel 112, and red light may be separated and condensed on the red pixel 113.

Nanoposts having various shapes may be variously arranged in the pixel-corresponding regions 131, 132, 133, and 134 shown in the plan view of FIG. 5A. The shapes and arrangement of nanoposts shown in the cross-sectional views of FIGS. 4A and 4B are also non-limiting examples. In FIGS. 4A and 4B, a first nanopost NP1 and a second nanoposts NP2 are provided in each region, but this is merely an example. The number of first nanoposts NP1 and the number of second nanoposts NP2 provided in each region may vary different from each other, and in some regions, second nanoposts NP2 corresponding to first nanoposts NP1 may not be provided. The first nanoposts NP1 and the second nanoposts NP2 may be arranged along boundaries between regions.

Characteristics of Bayer-pattern pixel arrangement may be applied to the arrangement of nanoposts in the pixel-corresponding regions 131, 132, 133, and 134. In the Bayer-pattern pixel arrangement, the blue and red pixels 112 and 113 are adjacent to the first and second green pixels 111 and 114 (the same color) both in the first direction (X direction) and the second direction (Y direction), whereas the first green pixels 111 are adjacent to different colors, that is, blue pixels 112 in the first direction (X direction) and the red pixels 113 in the second direction (Y direction), and the second green pixels 114 are adjacent to different colors, that is, the red pixels 113 in the first direction (X direction) and the blue pixels 112 in the second direction (Y direction). In addition, each of the first and second green pixels 111 and 114 is adjacent to the same color, that is, green pixels at four corners; each of the blue pixels 112 is adjacent to the same color, that is, red pixels 113 at four corners; and each of the red pixels 113 is adjacent to the same color, that is, blue pixels 112 at four corners. Therefore, the first nanoposts NP1 may be arranged in 4-fold symmetry in the blue and red pixel-corresponding regions 132 and 133 which correspond to the blue and red pixels 112 and 113 and may be arranged in 2-fold symmetry in the first and second green pixel-corresponding regions 131 and 134. The first nanoposts NP1 arranged in the first and second green pixel-corresponding regions 131 and 134 may have an asymmetric cross-sectional shape having different widths in the first direction (X direction) and the second direction (Y direction), and the first nanoposts NP1 arranged in the blue and red pixel-corresponding regions 132 and 133 may have a symmetrical cross-sectional shape having the same width in the first direction (X direction) and the second direction (Y direction). The first nanoposts NP1 may be arranged in the first and second green pixel-corresponding regions 131 and 134 at an angle of about 90 degrees with respect to each other.

The second nanoposts NP2 of the second lens layer LE2 may be arranged by considering the above-mentioned shift conditions relative to the first nanoposts NP1.

The arrangement rules for the first nanoposts NP1 and the second nanoposts NP2 are examples for wavelength separation corresponding to the pixel arrangement, and are not limited to the description given above or the patterns illustrated in the drawings.

The spacer layer 120 is arranged between the sensor substrate 110 and the color separation lens array 130. The spacer layer 120 has a function of maintaining a constant distance between the sensor substrate 110 and the color separation lens array 130. The spacer layer 120 may include a dielectric material transparent to visible light, for example, $SiO_2$, silanol-based glass (such as siloxane-based SOG), or the like, which has a refractive index lower than the refractive index of the nanoposts NP and low absorptivity in a visible light band. The thickness h of the spacer layer 120 may be within a range of $ht-p \leq h \leq ht+p$. Here, ht refers to the focal length of the color separation lens array 130 with respect to the center wavelength of a wavelength band in which the color separation lens array 130 splits light, and p refers to a pixel pitch. In an example embodiment, the pixel pitch may be several micrometers (μm) or less, for example, about 2 μm or less, about 1.5 μm or less, about 1 μm or less, or about 0.7 μm or less. The pixel pitch may be within a range of about 0.5 μm to about 1.5 μm. The thickness of the spacer layer 120 may be determined based on, for example, 540 nm, which is the center wavelength of green light.

The color filter array 170 may be arranged between the sensor substrate 110 and the color separation lens array 130, and in this case, the thickness of the spacer layer 120 may be set by considering the thickness of the color filter array 170 such that the thickness of the spacer layer 120 may be less than the focal length of the color separation lens array 130 with respect to the center wavelength of a wavelength band in which the color separation lens array 130 separates colors. For example, the thickness of the spacer layer 120 may be set to be less than the focal length of the color separation lens array 130 with respect to green light.

The spacer layer 120 may also support the first and second nanoposts NP1 and NP2 of the color separation lens array 130. The spacer layer 120 may include a dielectric material having a refractive index less than the refractive index of the first nanoposts NP1. When the first peripheral material E1 includes a material having a higher refractive index than the first nanoposts NP1, the spacer layer 120 may include a material having a lower refractive index than the first peripheral material E1.

Figure 6A:
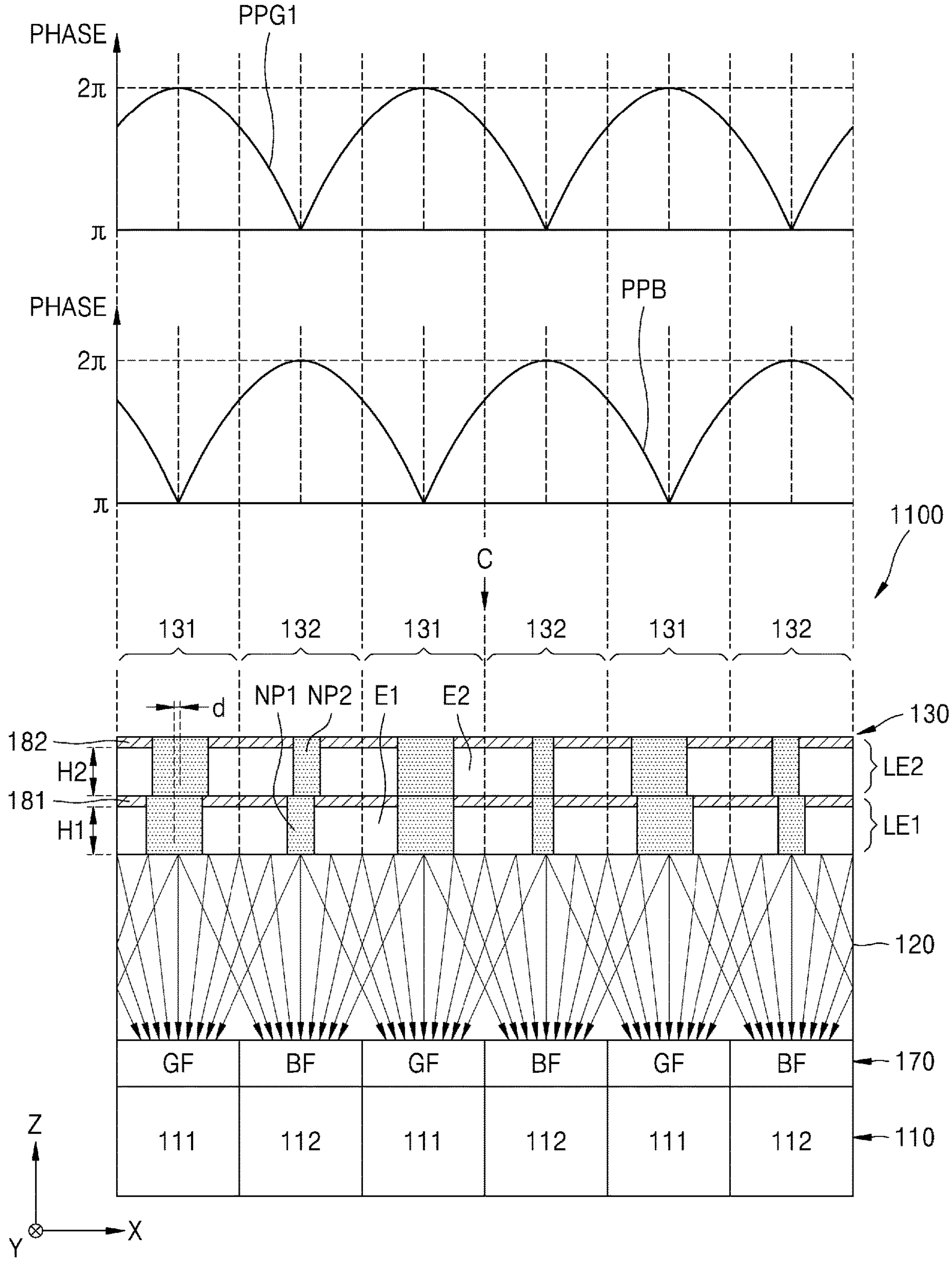
FIG. 6A is a view illustrating the cross-section shown in FIG. 4A, together with the phase profiles of green light and blue light passing through the color separation lens array.
Figure 6B:
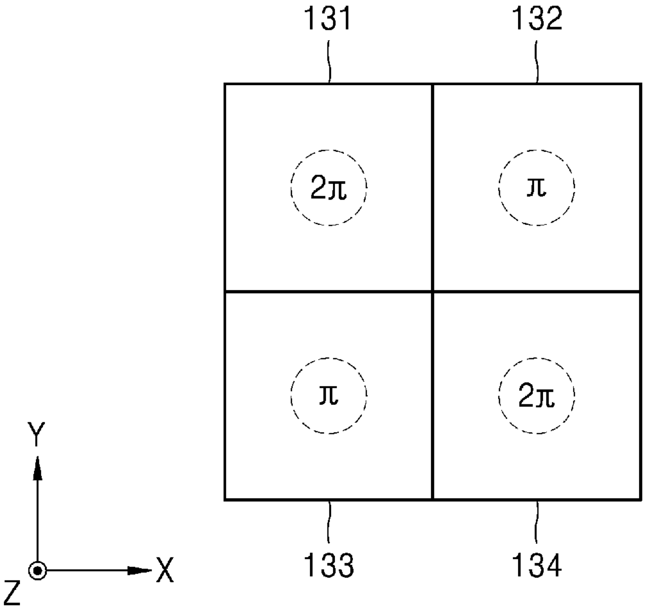
FIG. 6B is a view illustrating the phase of green light at the centers of pixel-corresponding regions when the green light has passed through the color separation lens array.
Figure 6C:
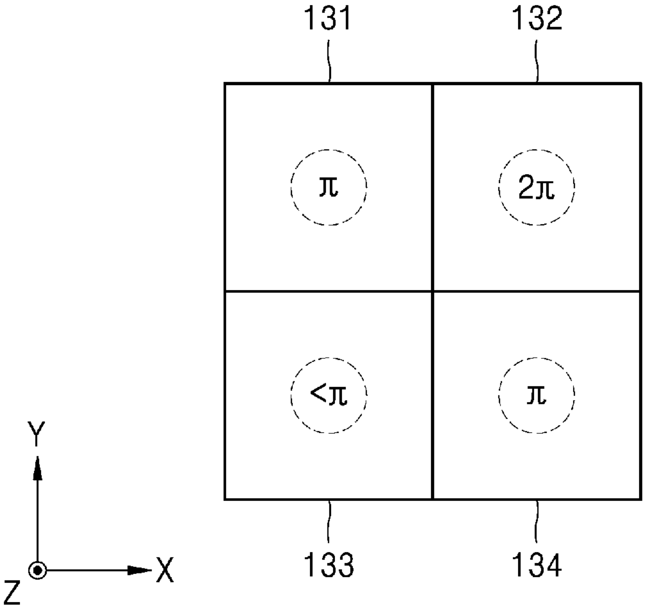
FIG. 6C is a view illustrating the phase of blue light at the centers of the pixel-corresponding regions when the blue light has passed through the color separation lens array.

FIG. 6A is a view illustrating the cross-section shown in FIG. 4A, together with the phase profiles of green light and blue light passing through the color separation lens array 130; FIG. 6B is a view illustrating the phase of green light at the centers of pixel-corresponding regions 131, 132, 133, and 134 when the green light has passed through the color separation lens array 130; and FIG. 6C is a view illustrating the phase of blue light at the centers of the pixel-corresponding regions 131, 132, 133, and 134 when the blue light has passed through the color separation lens array 130. The phase profiles of green light and blue light shown in FIG. 6A are similar to the phase profiles of light having the first wavelength λ1 and light having the second wavelength λ2 which are described by example with reference to FIG. 2B.

Referring to FIGS. 6A and 6B, green light passing through the color separation lens array 130 may have a first green light phase profile PPG1, which is highest at the center of a first green pixel-corresponding region 131 and decreases in a direction away from the center of the first green pixel-corresponding region 131. For example, at a position immediately after the color separation lens array 130, that is, at the lower surface of the color separation lens array 130 or the upper surface of the spacer layer 120, the phase of green light peaks at the center of a first green pixel-corresponding region 131, gradually decreases in the form of concentric circles in a direction away from the center of the first green pixel-corresponding region 131, and reaches the lowest value at the centers of blue and red pixel-corresponding regions 132 and 133 in the X-direction and Y-direction and at a contact point between the first green pixel-corresponding region 131 and a second green pixel-corresponding region 134 in a diagonal direction. When the phase of green light output from the center of the first green pixel-corresponding region 131 is 2π and is set as a reference, the phase of green light may be about 0.9π to about 1.1π at the centers of the blue and red pixel-corresponding regions 132 and 133, about 2π at the center of the second green pixel-corresponding region 134, and about 1.1π to about 1.5π at the contact point between the first green pixel-corresponding region 131 and the second green pixel-corresponding region 134. Therefore, the phase of green light, which has passed through the center of the first green pixel-corresponding region 131, may different by about 0.9π to about 1.1π from the phase of green light, which has passed through the centers of the blue and red pixel-corresponding regions 132 and 133.

In addition, the first green light phase profile PPG1 does not mean that the phase delay of green light passing through the center of the first green pixel-corresponding region 131 is largest, and when the phase of light passing through the center of the first green pixel-corresponding region 131 is set to be 2π and the phase of light passing through other positions is greater than 2π due to a relatively large phase delay, the phase of light may be expressed by subtracting 2π therefrom, that is, by a wrapped phase profile. For example, when the phase of light passing through the center of the first green pixel-corresponding region 131 is set to be 2π and the phase of light passing through the center of the blue pixel-corresponding region 132 is 3π, the phase of light passing through the center of the blue pixel-corresponding region 132 may be expressed as π by subtracting 2π from 3π(when n=1).

Referring to FIGS. 6A and 6C, blue light passing through the color separation lens array 130 may have a blue light phase profile PPB, which is greatest at the center of the blue pixel-corresponding region 132 and decreases in a direction away from the center of the blue pixel-corresponding region 132. For example, immediately after blue light passes through the color separation lens array 130, the phase of the blue light peaks at the center of the blue pixel-corresponding region 132, gradually decreases in the form of concentric circles in a direction away from the center of the blue pixel-corresponding region 132, and reaches the lowest value at the centers of the first and second green pixel-corresponding regions 131 and 134 in the X-direction and Y-direction and at the center of the red pixel-corresponding region 133 in a diagonal direction. When the phase of blue light at the center of the blue pixel-corresponding region 132 is set to be 2π, the phase of blue light at the centers of the first and second green pixel-corresponding regions 131 and 134 may be, for example, about 0.9π to about 1.1π; and the phase of blue light at the center of the red pixel-corresponding region 133 may be, for example, about 0.5π to about 0.9π, that is, less than the phase of blue light at the centers of the first and second green pixel-corresponding regions 131 and 134.

Figure 6D:
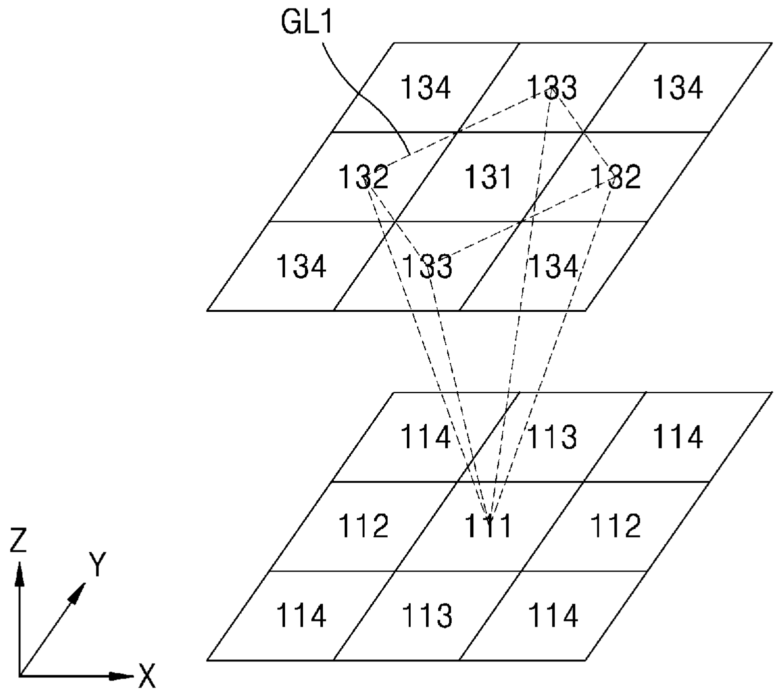
FIG. 6D is a view illustrating, by example, the traveling direction of green light entering a first green light-condensing region.
Figure 6E:
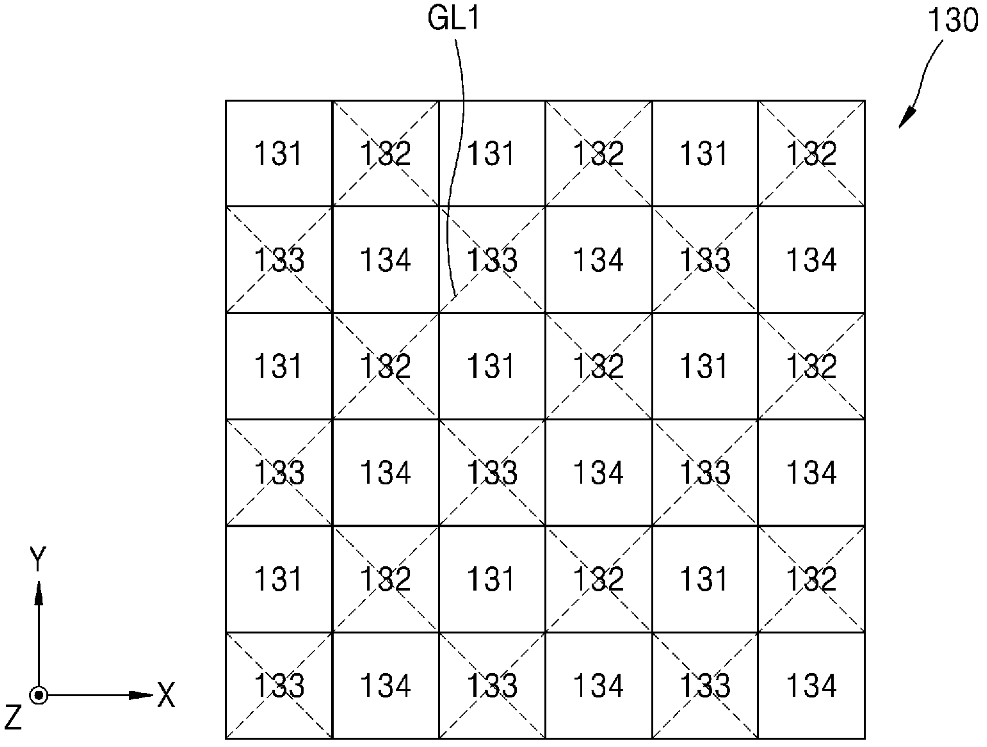
FIG. 6E is a view illustrating an example array of first green light-condensing regions.

FIG. 6D illustrates, by example, the traveling direction of green light entering a first green light-condensing region GL1, and FIG. 6E illustrates an example array of first green light-condensing regions GL1.

Green light incident around a first green pixel-corresponding region 131 is condensed on a first green pixel 111 by the color separation lens array 130 as shown in FIG. 6D, and the first green pixel 111 receives green light coming from blue and red pixel-corresponding regions 132 and 133 as well as the first green pixel-corresponding region 131. That is, according to the phase profile of green light described with reference to FIGS. 6A and 6B, the first green pixel 111 receives green light passing through a first green light-condensing region GL1 defined by connecting the centers of two blue pixel-corresponding regions 132 each adjoining one side of the first green pixel-corresponding region 131 and the centers of two red pixel-corresponding regions 133 each adjoining one side of the first green pixel-corresponding region 131. Therefore, as shown in FIG. 6E, the color separation lens array 130 may operate as an array of first green light-condensing regions GL1 condensing green light on first green pixels 111. The first green light-condensing regions GL1 may be greater than first green pixels 111 corresponding thereto. For example, the area of each of the first green light-condensing regions GL1 may be about 1.2 times to about 2 times the area of a corresponding first green pixel 111.

Figure 6F:
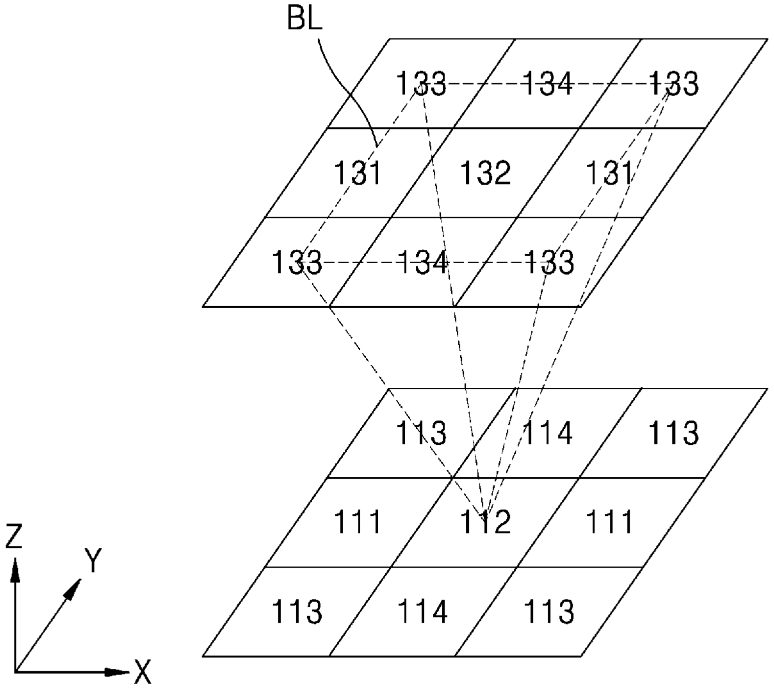
FIG. 6F is view illustrating, by example, the traveling direction of blue light entering a blue light-condensing region.
Figure 6G:
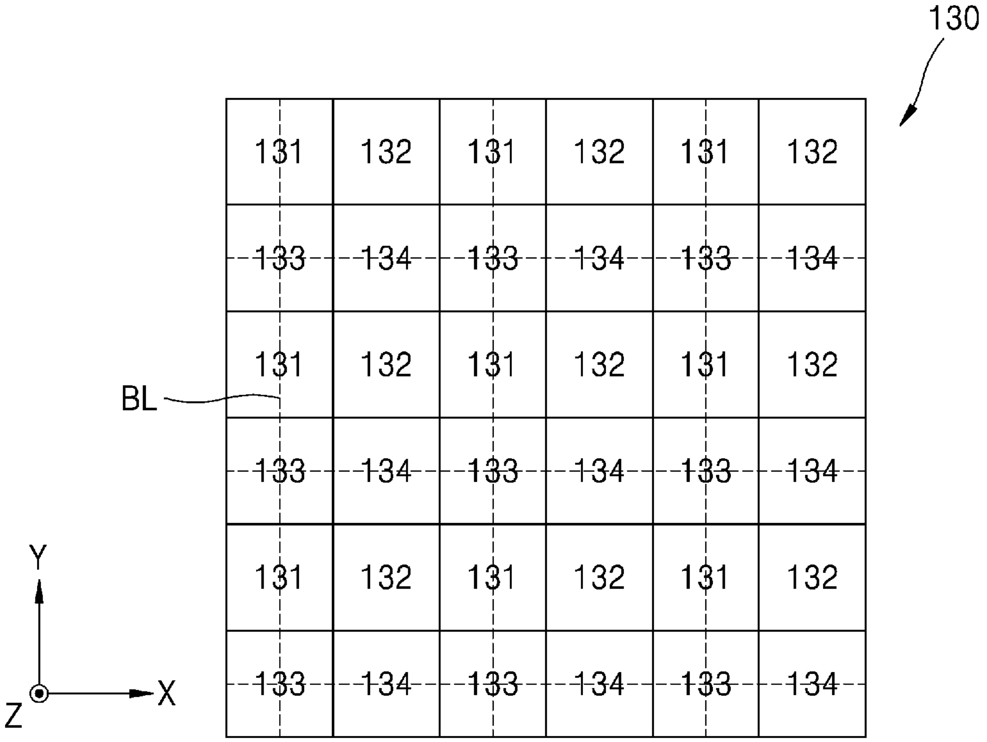
FIG. 6G is a view illustrating an example array of blue light-condensing regions.

FIG. 6F illustrates, by example, the traveling direction of blue light entering a blue light-condensing region BL, and FIG. 6G illustrates an example array of blue light-condensing regions BL.

Blue light is condensed on a blue pixel 112 by the color separation lens array 130 as shown in FIG. 6*f*, and the blue pixel 112 receives blue light coming from pixel-corresponding regions 131, 132, 133, and 134. According to the phase profile of blue light described above with reference to FIGS. 6A and 6C, the blue pixel 112 receives blue light passing through a blue light-condensing region BL defined by connecting the centers of four red pixel-corresponding regions 133 each having a corner adjoining a blue pixel-corresponding region 132. Therefore, as shown in FIG. 6G, the color separation lens array 130 may operate as an array of blue light-condensing regions BL condensing blue light on blue pixels. The blue light-condensing regions BL may be larger than blue pixels 112 corresponding thereto. For example, the area of each of the blue light-condensing regions BL may be, for example, about 1.5 times to about 4 times the area of a corresponding blue pixel 11. The blue light-condensing regions BL may partially overlap the first green light-condensing regions GL1 described above, second green light-condensing regions GL2 (described later), and red light-condensing regions RL (described later).

Figure 7A:
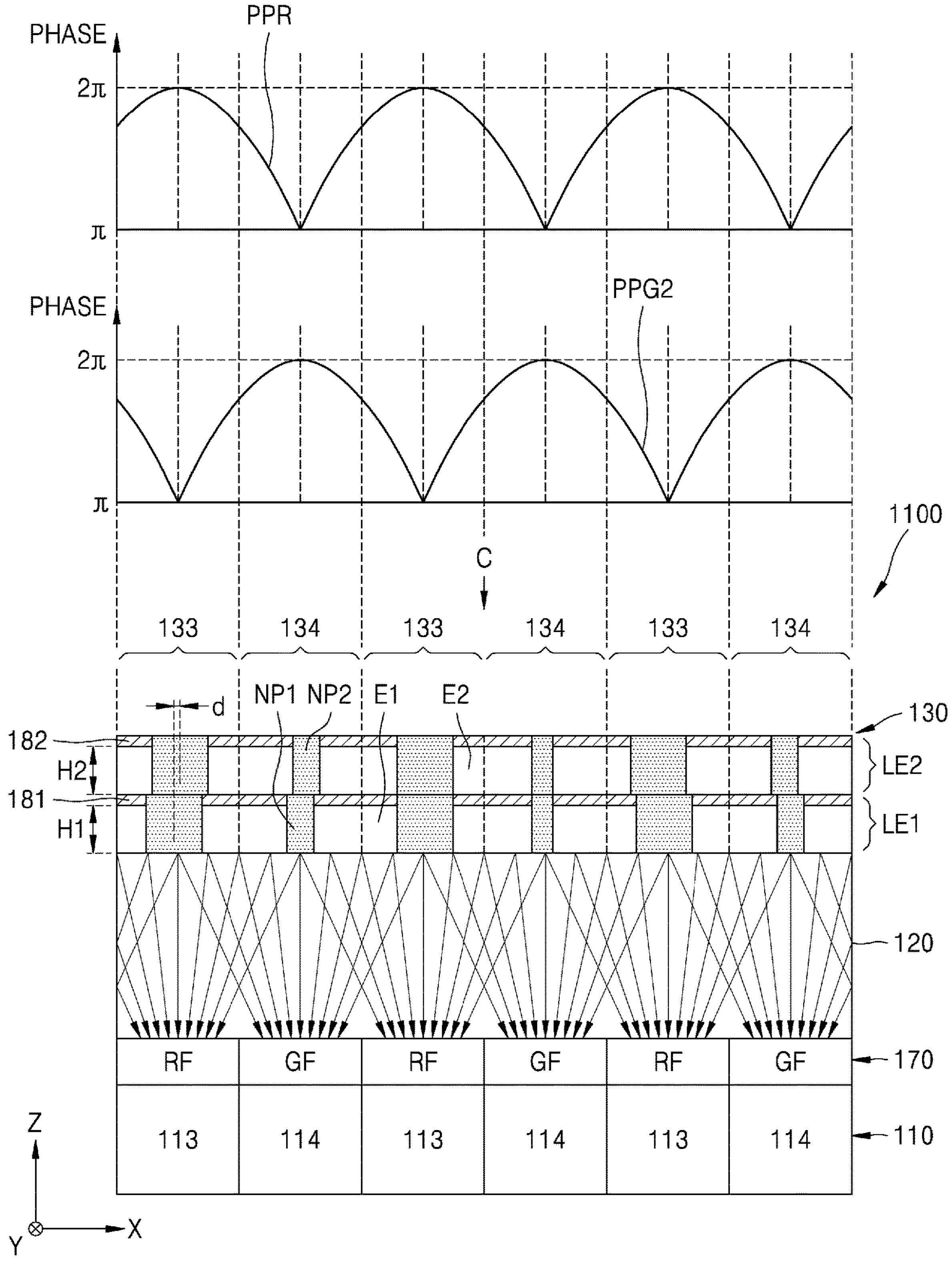
FIG. 7A is a view illustrating the cross-section shown in FIG. 4B, together with the phase profiles of red light and green light passing through the color separation lens array.
Figure 7B:
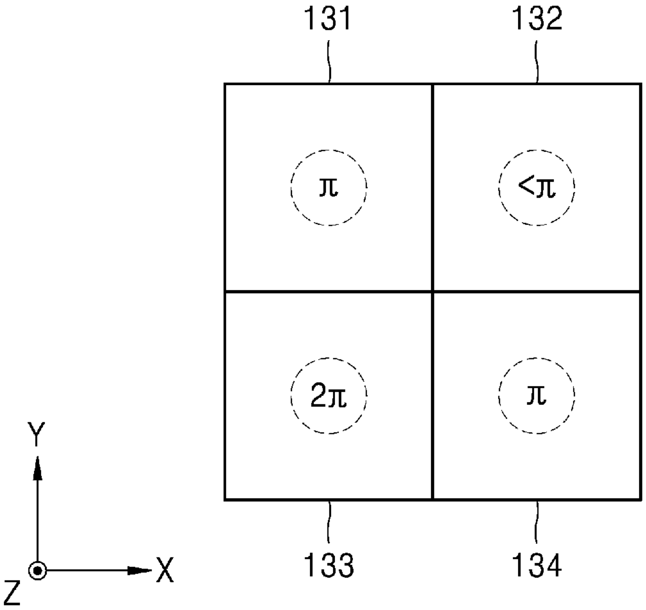
FIG. 7B is a view illustrating the phase of red light at the centers of pixel-corresponding regions when the red light has passed through the color separation lens array.

FIG. 7A is a view illustrating the cross-section shown in FIG. 4B, together with the phase profiles of red light and green light passing through the color separation lens array 130; FIG. 7B is a view illustrating the phase of red light at the centers of pixel-corresponding regions 131, 132, 133, and 134 when the red light has passed through the color separation lens array 130; and FIG. 7C is a view illustrating the phase of green light at the centers of the pixel-corresponding regions 131, 132, 133, and 134 when the green light has passed through the color separation lens array 130.

Referring to FIGS. 7A and 7B, red light passing through the color separation lens array 130 may have a red light phase profile PPR, which is greatest at the center of a red pixel-corresponding region 133 and decreases in a direction away from the center of the red pixel-corresponding region 133. For example, immediately after red light passes through the color separation lens array 130, the phase of the red light peaks at the center of the red pixel-corresponding region 133, gradually decreases in the form of concentric circles in a direction away from the center of the red pixel-corresponding region 133, and reaches the lowest value at the centers of first and second green pixel-corresponding regions 131 and 134 in the X-direction and Y-direction and at the center of the blue pixel-corresponding region 132 in a diagonal direction. When the phase of red light at the center of the red pixel-corresponding region 133 is set to be 2π, the phase of red light at the centers of the first and second green pixel-corresponding regions 131 and 134 may be, for example, about 0.9π to about 1.1π; and the phase of red light at the center of the blue pixel-corresponding region 132 may be, for example, about 0.6π to about 0.9π, that is, less than the phase of red light at the centers of the first and second green pixel-corresponding regions 131 and 134.

Figure 7C:
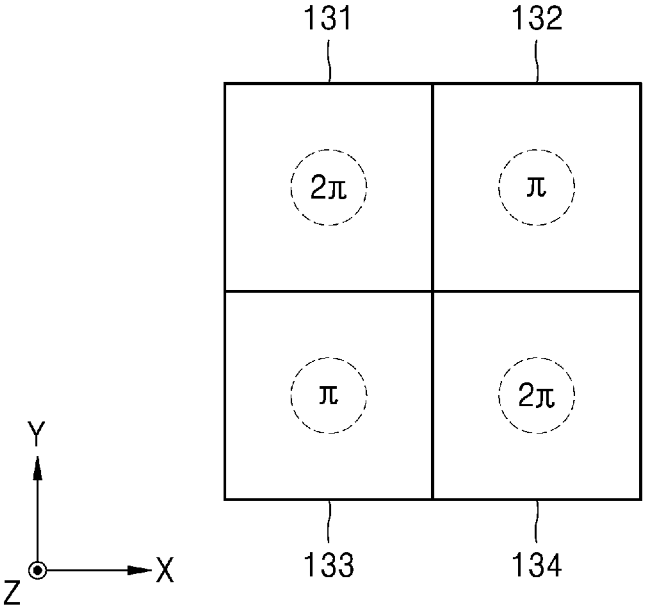
FIG. 7C is a view illustrating the phase of green light at the centers of the pixel-corresponding regions when the green light has passed through the color separation lens array.

Referring to FIGS. 7A and 7C, green light passing through the color separation lens array 130 may have a green light phase profile PPG2, which is greatest at the center of the second green pixel-corresponding region 134 and decreases in a direction away from the center of the second green pixel-corresponding region 134. Comparing the first green light phase profile PPG1 shown in FIG. 6A and the second green light phase profile PPG2 shown in FIG. 7A, the second green light phase profile PPG2 is shifted from the first green light phase profile PPG1 in parallel to the X and Y directions by one pixel pitch. That is, the first green light phase profile PPG1 is greatest at the center of the first green pixel-corresponding region 131, whereas the second green light phase profile PPG2 is greatest at the center of the second green pixel-corresponding region 134 which is away from the center of the first green pixel-corresponding region 131 by one pixel pitch in the X and Y directions. The phase profiles at the centers of the pixel-corresponding regions 131, 132, 133, and 134 which are shown in FIGS. 6B and 7C are the same. The phase profile of green light will now be described again based on the second green pixel-corresponding region 134. When the phase of green light output from the center of the second green pixel-corresponding region 134 is 2π and is set as a reference, the phase of green light may be about 0.9π to about 1.1π at the centers of the blue and red pixel-corresponding regions 132 and 133, about 2π at the center of the first green pixel-corresponding region 131, and about 1.1π to about 1.5π at a contact point between the first green pixel-corresponding region 131 and the second green pixel-corresponding region 134.

Figure 7D:
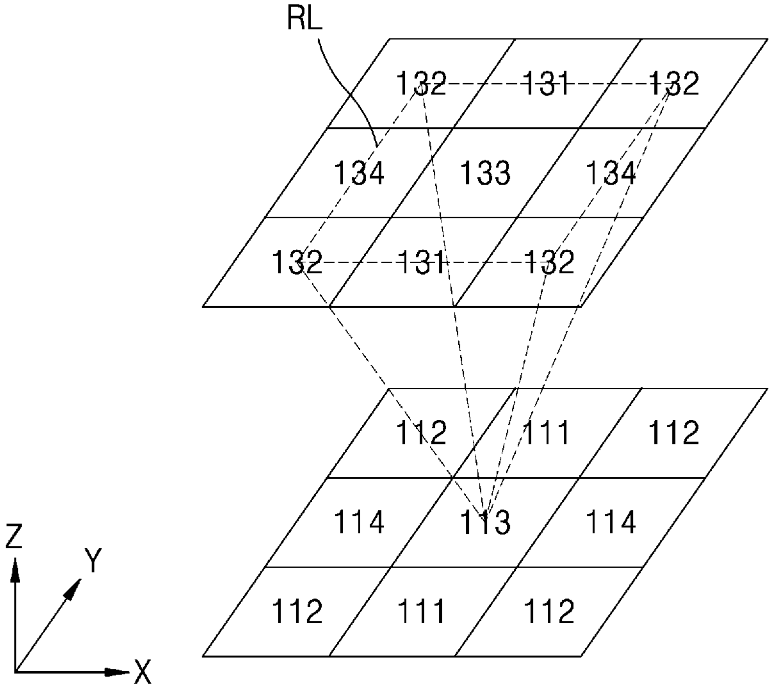
FIG. 7D is a view illustrating, by example, the traveling direction of red light entering a red light-condensing region.
Figure 7E:
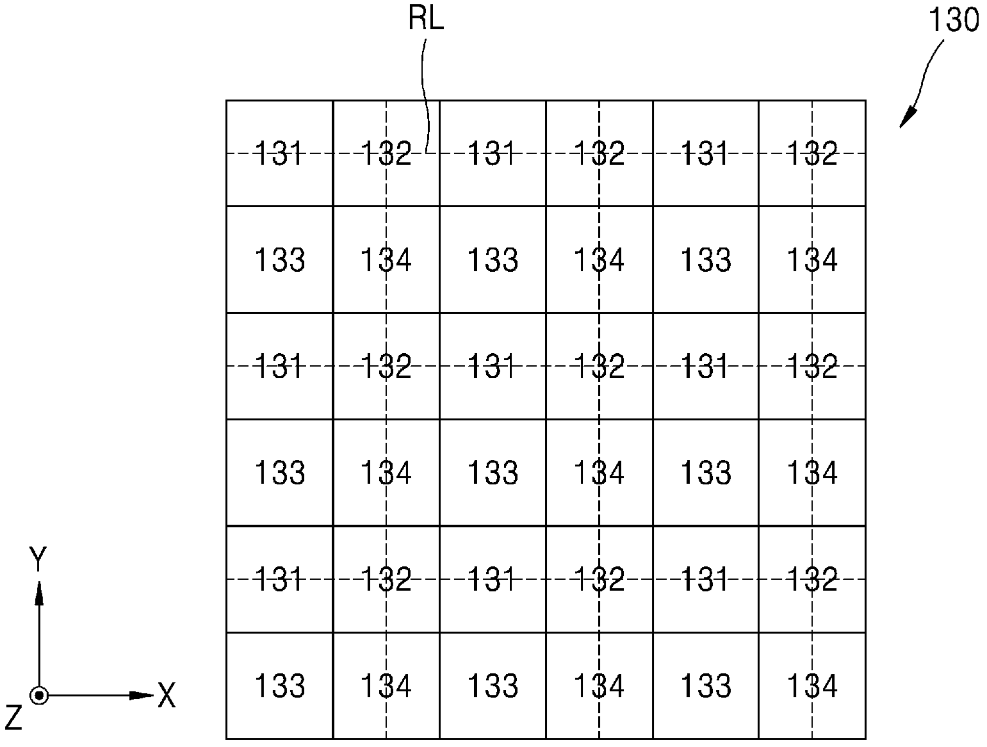
FIG. 7E is a view illustrating an example array of red light-condensing regions.

FIG. 7D illustrates, by example, the traveling direction of red light entering a red light-condensing region RL, and FIG. 7E illustrates an example array of red light-condensing regions RL.

Red light is condensed on a red pixel 113 by the color separation lens array 130 as shown in FIG. 7D, and the red pixel 113 receives red light coming from pixel-corresponding regions 131, 132, 133, and 134. According to the phase profile of red light described above with reference to FIGS. 7A and 7B, red light is condensed on the red pixel 113 through a red light-collecting region RL defined by connecting the centers of four blue pixel-corresponding regions 132 each having a corner adjoining a red pixel-corresponding region 133. Therefore, as shown in FIG. 7E, the color separation lens array 130 may operate as an array of red light-condensing regions RL condensing red light on red pixels. The area of each of the red light-condensing regions RL may be greater than the area of a corresponding red pixel 113. For example, the area of each of the red light-condensing regions RL may be, for example, about 1.5 times to about 4 times the area of a corresponding red pixel 113. The red light-condensing regions RL may overlap the first and second green light-condensing regions GL1 and GL2 and the blue light-condensing regions BL.

Figure 7F:
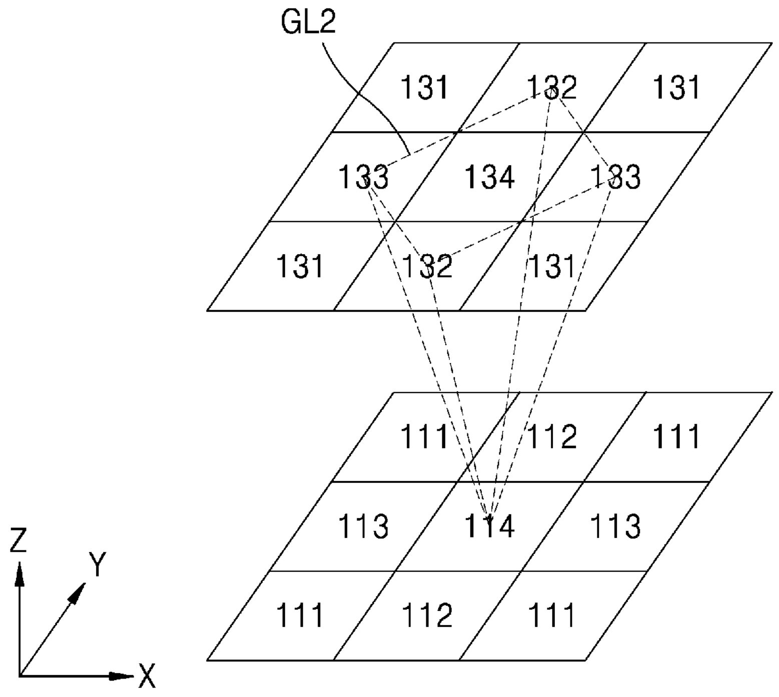
FIG. 7F is a view illustrating, by example, the traveling direction of green light entering a second green light-condensing region.
Figure 7G:
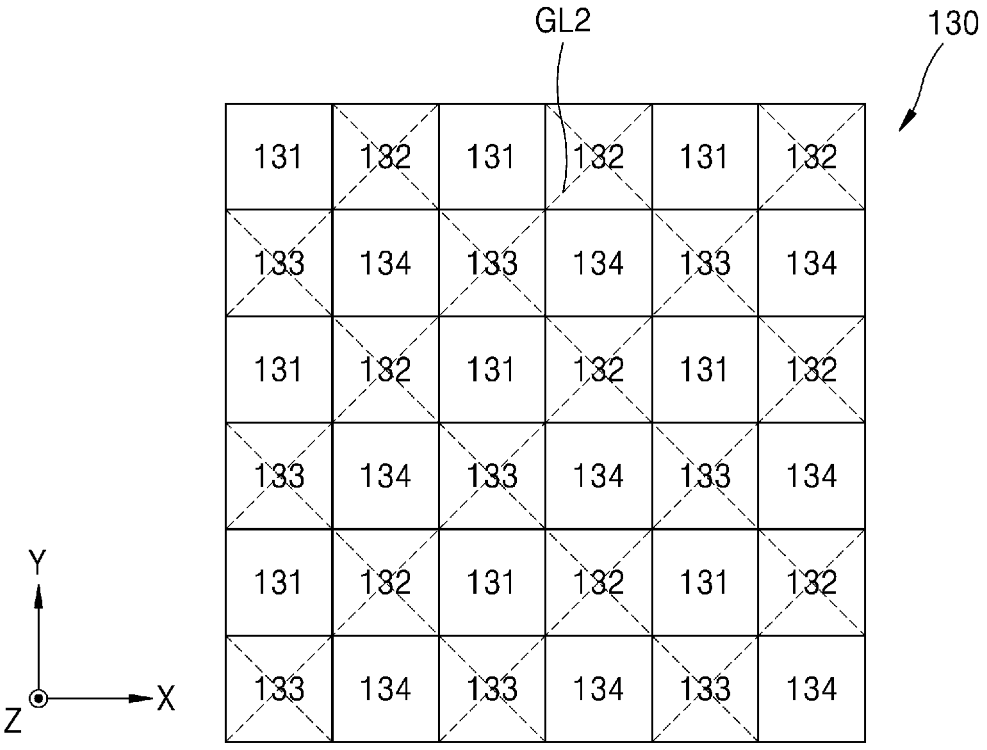
FIG. 7G is a view illustrating an example array of green light-condensing regions.

Referring to FIGS. 7F and 7G, like green light incident around a first green pixel-corresponding region 131 and traveling as described above, green light incident around a second green pixel-corresponding region 134 travels and is condensed on a second green pixel 114 as shown in FIG. 7F. Therefore, as shown in FIG. 7G, the color separation lens array 130 may operate as an array of second green light-condensing regions GL2 condensing green light on second green pixels 114. The area of each of the second green light-condensing regions GL2 may be greater than the area of a corresponding second green pixel 114. For example, the area of each of the second green light-condensing regions GL2 may be about 1.2 times to about 2 times the area of a corresponding second green pixel 114.

Figure 8A:
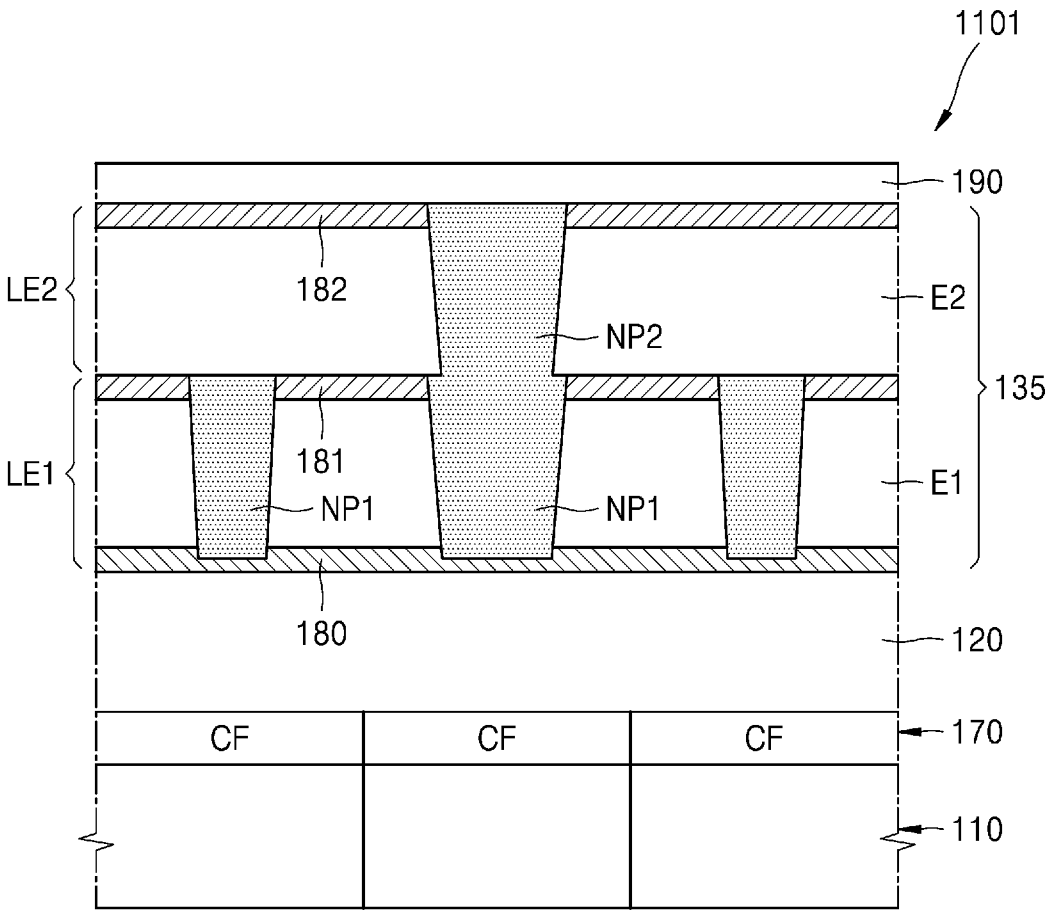
FIGS. 8A to 8C are views illustrating a pixel array of an image sensor according to another embodiment, respectively showing a color separation lens array from different positions.
Figure 8B:
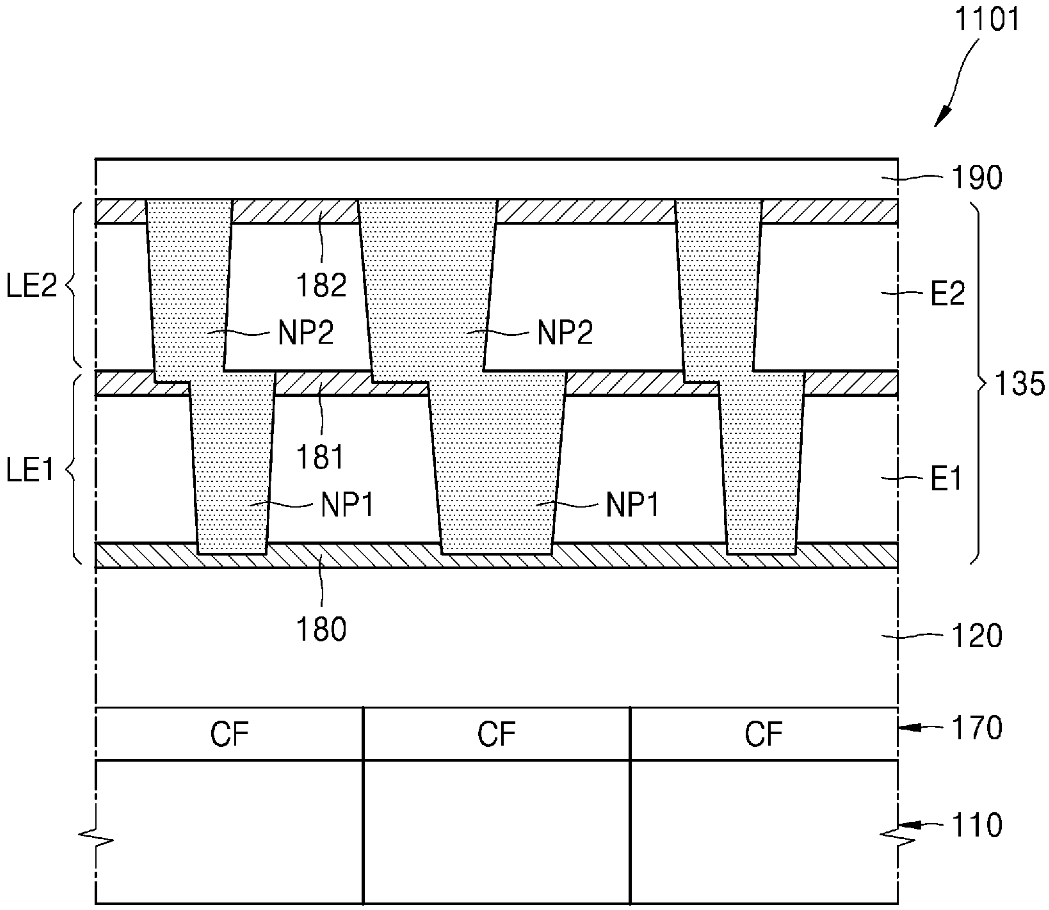
Figure 8C:
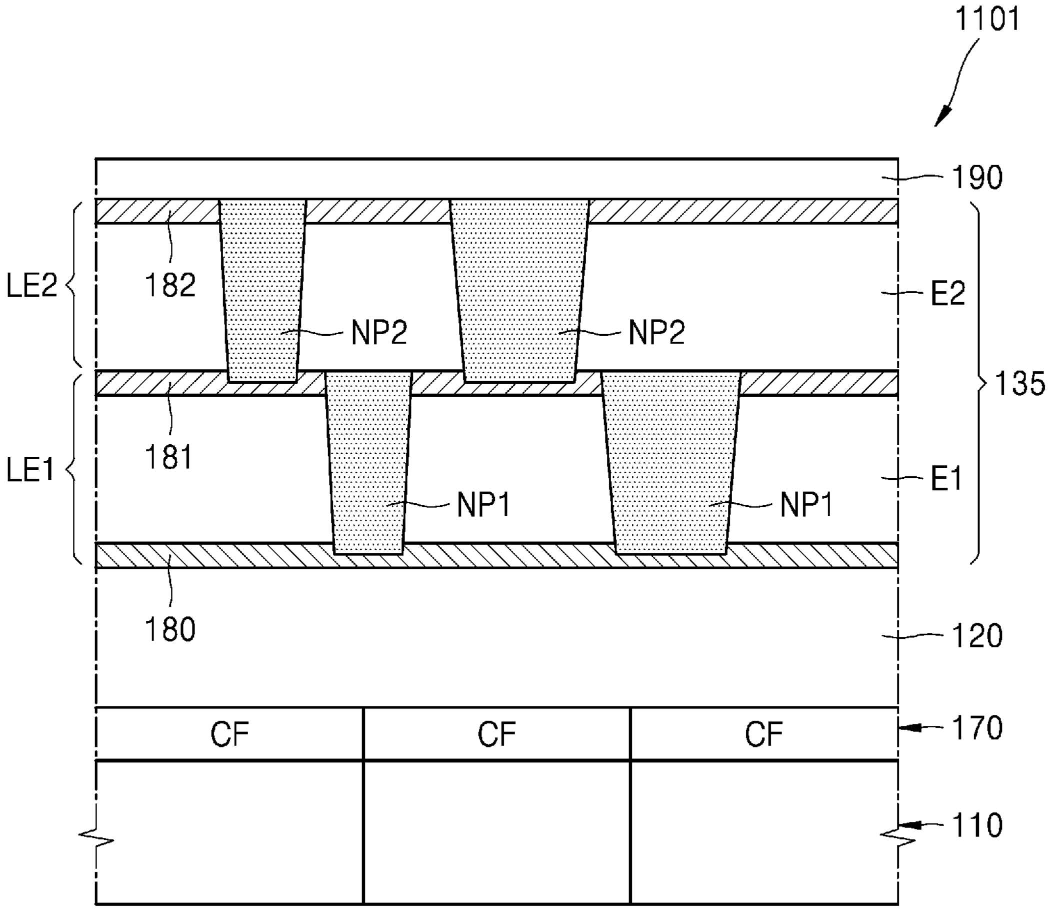

FIGS. 8A to 8C illustrate a pixel array 1101 of an image sensor according to another example embodiment, respectively showing a color separation lens array 135 from different positions.

Referring to FIGS. 8A to 8C, the pixel array 1101 includes a sensor substrate 110, a spacer layer 120, and the color separation lens array 135, and a color filter array 170 may be arranged between the sensor substrate 110 and the spacer layer 120.

Pixels of a plurality of light sensing cells provided in the sensor substrate 110, and the color filter array 170 have a color relationship with regions of the color separation lens array 135 as described above, and a description thereof will not be presented below.

The color separation lens array 135 includes a first lens layer LE1 and a second lens layer LE2. The first lens layer LE1 includes a plurality of first nanoposts NP1 and a first peripheral material E1 provided around the first nanoposts NP1. The second lens layer LE2 includes a plurality of second nanoposts NP2 and a second peripheral material E2 provided around the second nanoposts NP2.

According to an example embodiment, a first CMP stop layer 181 is provided on the entire surface between the first lens layer LE1 and the second lens layer LE2 except for the upper surfaces of the first nanoposts NP1, and a second CMP stop layer 182 is provided on the second lens layer LE2 except for the upper surfaces of the second nanoposts NP2.

A protective layer 190 may be further arranged on the second lens layer LE2. The protective layer 190 may include a material serving as an anti-reflection layer. When light is incident on the pixel array 1101, the anti-reflection layer reduces reflection by the upper surface of the color separation lens array 135, thereby improving the light use efficiency of the pixel array 1101. In other words, the anti-reflection layer allows light incident on the pixel array 1101 from the outside to pass through the color separation lens array 135 without being reflected by the upper surface of the color separation lens array 135 such that the light may be sensed by the sensor substrate 110.

The anti-reflection layer may have a structure in which one or a plurality of layers are stacked. For example, the anti-reflection layer may be a single layer including a material different from the material of the second lens layer LE2. The anti-reflection layer may include a plurality of material layers having different refractive indexes.

An etch stop layer 180 may be further provided between the spacer layer 120 and the first lens layer LE1. During manufacturing processes, the etch stop layer 180 may protect the spacer layer 120, which is a structure under the color separation lens array 135. The etch stop layer 180 may include $HfO_2$ and may have a thickness of about 3 nm to about 30 nm.

FIGS. 8A to 8C illustrate examples of the first nanoposts NP1 and the second nanoposts NP2 provided at different positions in the first lens layer LE1 and the second lens layer LE2 of the color separation array 135.

Referring to FIG. 8A, a first nanoposts NP1 and a second nanoposts NP2 which are adjacent to and correspond to each other in a vertical direction may be connected to each other. However, not all of the first nanoposts NP1 may be connected to an adjacent second nanoposts NP2. That is, second nanoposts NP2 may not be provided on upper portions of some of the first nanoposts NP1.

Referring to FIG. 8B, the first nanoposts NP1 and the second nanoposts NP2 may be connected to each other such that the first nanoposts NP1 and the second nanoposts NP2 may adjoin and correspond to each other in the vertical direction, and the distance between center axes of the first nanoposts NP1 and the second nanoposts NP2 may vary based on the position of the nanoposts NP1 and NP2 in the color separation lens array 130 of the image sensor.

Referring to FIG. 8C, the first nanoposts NP1 and the second nanoposts NP2 which are adjacent to and correspond to each other in the vertical direction may not be connected to each other but may be apart from each other. This structure may be provided in a region far from the center of the color separation lens array 130. Alternatively, for example, the structure may be present when the distance between the center axes of the first nanoposts NP1 and the second nanoposts NP2 which are at corresponding positions is greater than the widths of the first nanoposts NP1 and the second nanoposts NP2.

In the structures shown in FIGS. 8A to 8C, the first nanoposts NP1 and the second nanoposts NP2 have an inverted trapezoidal cross-sectional shape in a direction parallel to the height direction of the first nanoposts NP1 and the second nanoposts NP2. However, embodiments are not limited thereto, and as such, according to another embodiment, a different cross-sectional shape may be provided.

Figure 9:
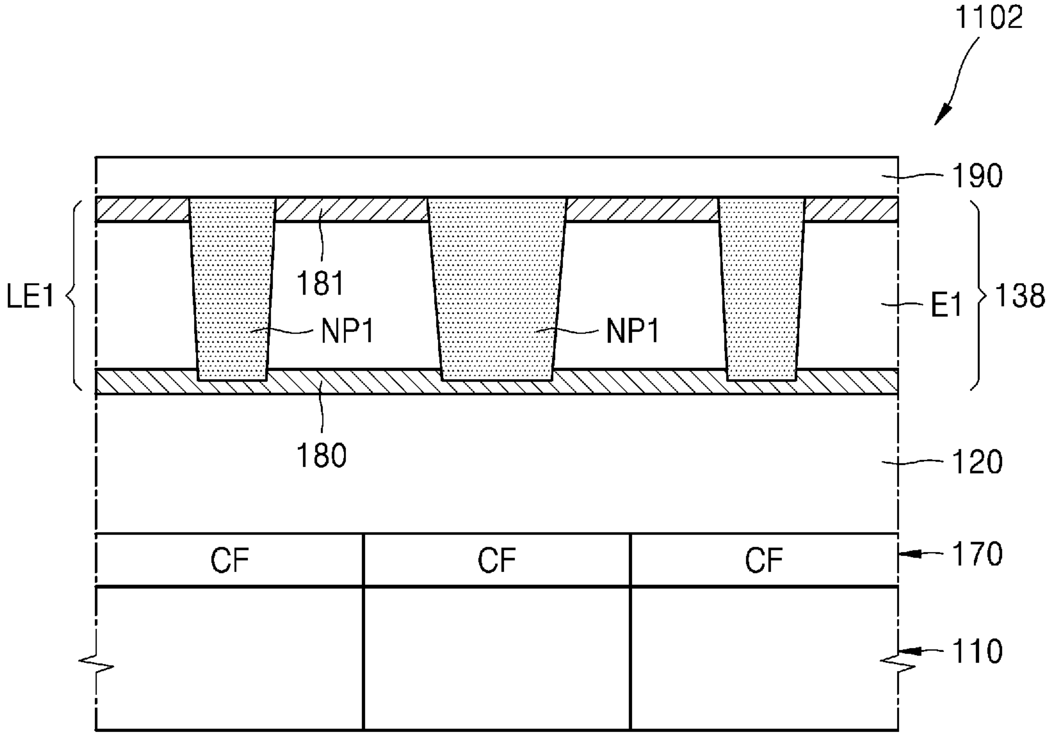
FIG. 9 is a cross-sectional view illustrating a pixel array of an image sensor according to another embodiment.

FIG. 9 is a cross-sectional view illustrating a pixel array 1102 of an image sensor according to another example embodiment.

The pixel array 1102 of example embodiment in FIG. 9 may be different from the pixel arrays 1100 (FIGS. 4A and 4B) and 1101 (FIGS. 8A-8C) described above in that a color separation lens array 138 has a single-layer structure.

The shapes of first nanoposts NP1 may be set according to positions to obtain an intended desired refractive index distribution with a single-layer structure instead of a multi-layer structure.

A first lens layer LE1 includes the first nanoposts NP1 and a first peripheral material E1 provided around the first nanoposts NP1. A first CMP stop layer 181 is formed on an entire surface of the first lens layer LE1 except for surfaces of the first nanoposts NP1, thereby reducing thickness dispersion of the first peripheral material E1 that may occur during a manufacturing process.

FIGS. 10A to 10E are views illustrating a method of manufacturing an image sensor according to an example embodiment.

Figure 10A:
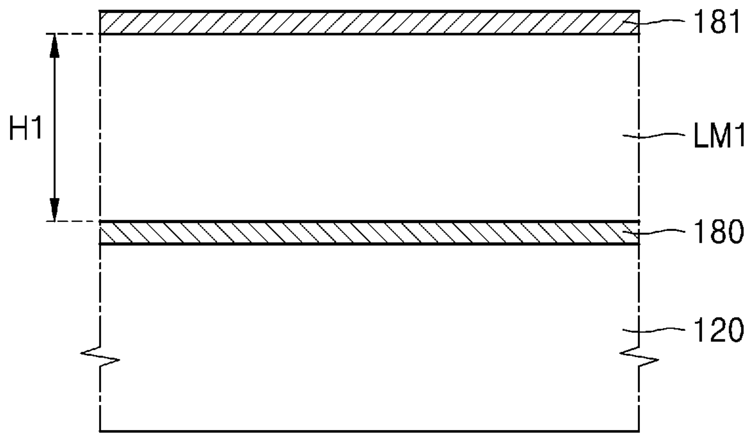
FIGS. 10A to 10E are views illustrating a method of manufacturing an image sensor according to an example embodiment.

Referring to FIG. 10A, a spacer layer 120, a first dielectric layer LM1 provided on the spacer layer 120, and a first CMP stop layer 181 provided on the first dielectric layer LM1 may be formed. An etch stop layer 180 may be formed between the spacer layer 120 and the first dielectric layer LM1.

The structure illustrated in FIG. 10A may be formed on a sensor substrate 110 or on a color filter array 170 formed on the sensor substrate 110, as described in FIG. 4A and FIG. 4B.

The spacer layer 120 may be, for example, a $SiO_2$ layer, and may be formed by various physical or chemical forming methods, for example, a thermal oxidation method.

The etch stop layer 180 may include a material for selectively etching the first dielectric layer LM1. That is, the etch stop layer 180 may include a material which is not etched by an etchant used for etching the first dielectric layer LM1. For example, the etch stop layer 180 may be an $HfO_2$ layer. The $HfO_2$ layer may be formed by a physical or chemical formation method such as physical vapor deposition (PVD), chemical vapor deposition (CVD), plasma-enhanced chemical vapor deposition (PECVD), or atomic layer deposition (ALD).

The first dielectric layer LM1 may be an $SiO_2$ layer and may include a low refractive index material such as a polymer material including SU-8 or PMMA, or SOG.

Although it is described that the first dielectric layer LM1 include a low refractive index material, embodiments are not limited thereto. The first dielectric layer LM1 may include a material having a refractive index greater than the low refractive index material described above. For example, the first dielectric layer LM1 may include at least one selected from the group consisting of c-Si, p-Si, a-Si, a Group III-V compound semiconductor (GaAs, GaP, or GaN), SiC, $TiO_2$, and SiN.

The first CMP stop layer 181 is a material for selectively performing CMP on a first nanopattern layer HM1 to be formed as a first nanopost NP1 (described later). That is, the first CMP stop layer 181 may include a material which is not easily removed when CMP is performed on the first nanopattern layer HM1. The first CMP stop layer 181 may include a material having CMP selectivity lower than the first nanopattern layer HM1. The first CMP stop layer 181 may include $Al_2O_3$, SiN, or $HfO_2$. The thickness of the first CMP stop layer 181 may be within a range of about 5 nm to about 50 nm. The thickness of the first CMP stop layer 181 may be set by considering the material and thickness of the first nanopattern layer HM1. For example, among the regions of the first nanopattern layer HM1 shown in FIG. 10C, the thickness of a portion, which is to be formed as the first nanoposts NP1 as shown in FIG. 10*d*, and the thickness of a portion, which is located on the first dielectric layer LM1 and is to be removed by CMP, may be considered when determining the thickness of the thickness of the first CMP stop layer 181. For example, the thickness of the first CMP stop layer 181 may increases in proportion to the thickness of the first nanopattern layer HM1 to be removed by CMP, and may be set such that the optical characteristics of a manufactured color separation lens array may not be negatively affected by the first CMP stop layer 181. The thickness of the first CMP stop layer 181 may be set by considering CMP dispersion of a wafer. For example, at the moment when CMP first reaches the first CMP stop layer 181 at a certain position of a wafer, the remaining thickness of the first nanopattern layer HM1 at another position at which CMP is not completed is determined as a CMP dispersion. In this case, the thickness of the CMP stop layer 181 may be determined by the CMP selectivity of the remaining first nanopattern layer HM1 relative to the first CMP stop layer 181. The thickness of the first CMP stop layer 181 may be within a range of about 2% to about 30% of a thickness, which is to be removed by CMP from the first nanopattern layer HM1.

Figure 10B:
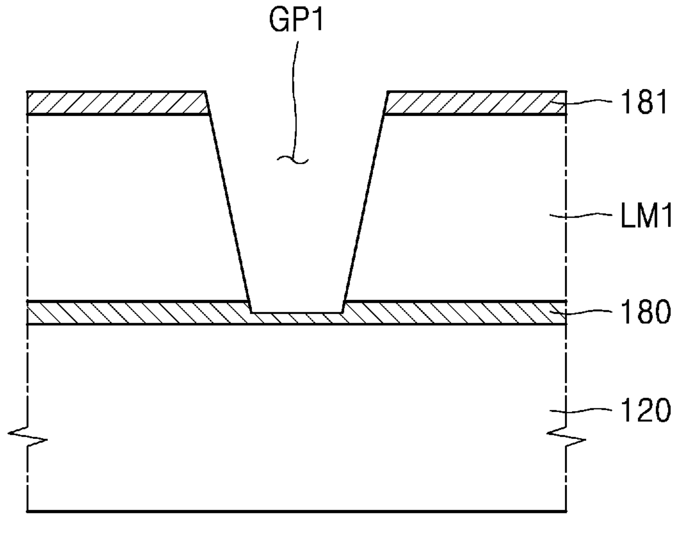

Referring to FIG. 10B, a first engraved pattern GP1 is formed by patterning both the first dielectric layer LM1 and the first CMP stop layer 181.

A photolithography process is used to form the first engraved pattern GP1. After forming a photoresist on the first CMP stop layer 181 shown in FIG. 10A and patterning the photoresist through an exposure process, the first engraved pattern GP1 may be formed by etching the first CMP stop layer 181 and the first dielectric layer LM1 at positions corresponding to an exposed pattern. For the etching of the first CMP stop layer 181 and the first dielectric layer LM1, for example, a Florin-based reactive ion etching process may be used. The etch stop layer 180 may prevent the spacer layer 120 from being damaged in the process.

Figure 10C:
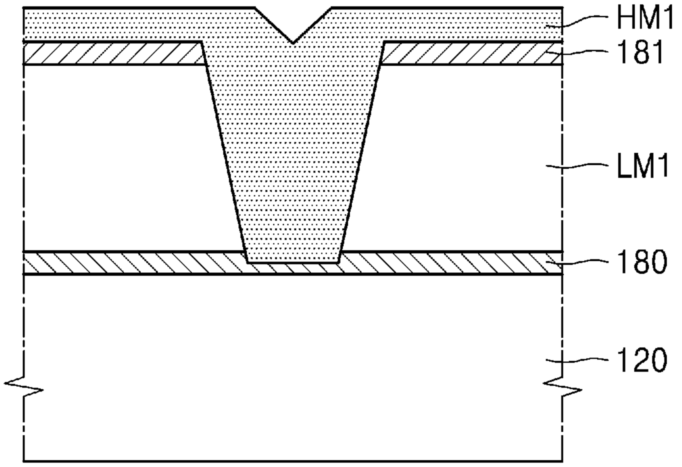
Figure 10D:
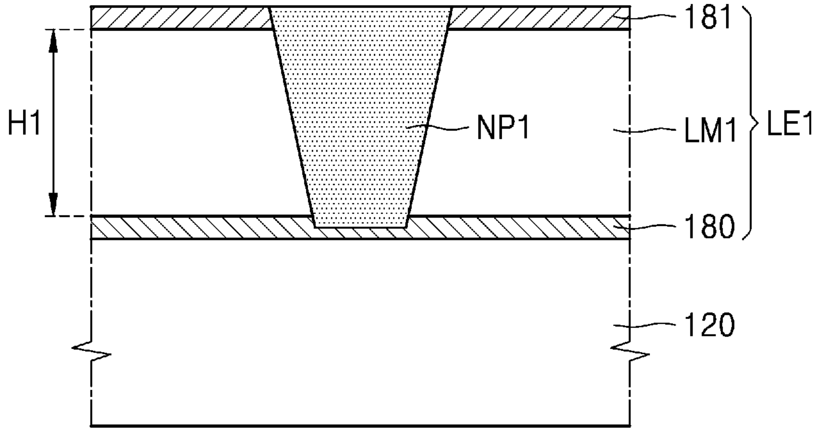

Referring to FIG. 10C, a material having a refractive index different from the refractive index of the first dielectric layer LM1 is applied to the inside of the first engraved pattern GP1 to form the first nanopattern layer HM1. The first nanopattern layer HM1 may fill the first engraved pattern GP1 and extend onto the upper surface of the first CMP stop layer 181.

The material used for forming the first nanopattern layer HM1 may include a material having a refractive index different from the refractive index of the first dielectric layer LM1, such as c-Si, p-Si, a-Si, a Group Ill-V compound semiconductor (GaAs, GaP, GaN, GaAs, or the like), SiC, $TiO_2$, or SiN. When the first dielectric layer LM1 include a material having a high refractive index, the first nanopattern layer HM1 may include a low refractive index material such as $SiO_2$, a polymer material including SU-8 or PMMA, or SOG. Atomic layer deposition or other various deposition methods may be used to form the first nanopattern layer HM1.

Next, as shown in FIG. 10D, the upper surface of the first nanopattern layer HM1 is planarized through a CMP process, thereby forming a first lens layer LE1 including a first nanopost NP1 having a desired shape and the first dielectric layer LM1 surrounding the first nanopost NP1. During the CMP process of the first nanopattern layer HM1, the first dielectric layer LM1 may be protected by the first CMP stop layer 181 formed on the upper surface of the first dielectric layer LM1 and may thus maintain a height H1. The height H1 of the first dielectric layer LM1 is set in the process shown in FIG. 10A and may be maintained even after the CMP process.

Figure 10E:
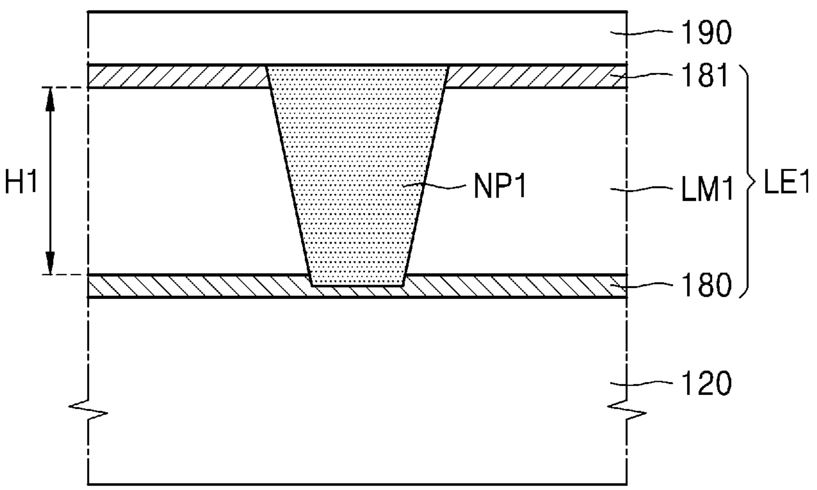

Next, as shown in FIG. 10E, a protective layer 190 may be further formed on the first lens layer LE1. The protective layer 190 may include a material serving as an anti-reflection layer.

According to the manufacturing method, an image sensor, which includes a color separation lens array in which first nanoposts NP1 are arranged in a single layer as in the color separation lens array 138 shown in FIG. 9, may be manufactured. The height H1 of the first dielectric layer LM1 which is set and formed according to design requirements may be maintained during the manufacturing process of the first lens layer LE1, and thus an intended refractive index distribution may be realized.

Figure 11A:
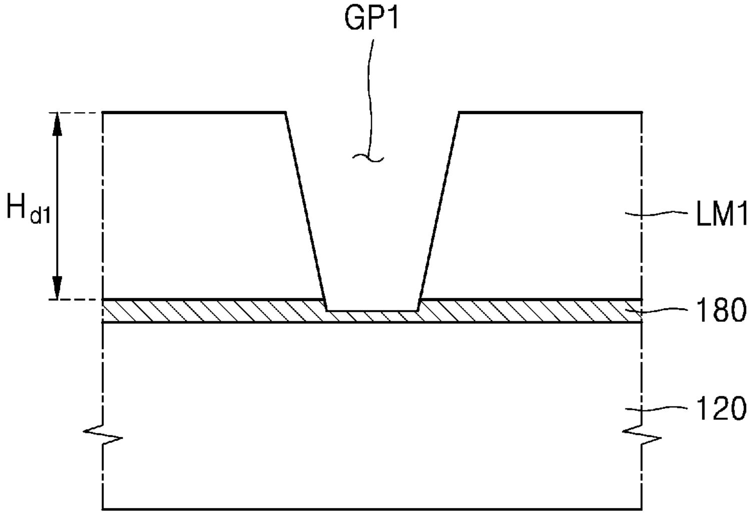
FIGS. 11A to 11C are views illustrating a method of manufacturing an image sensor according to a comparative example.
Figure 11B:
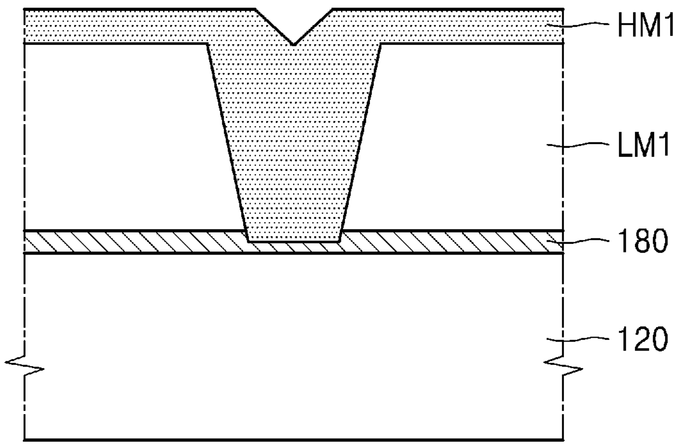
Figure 11C:
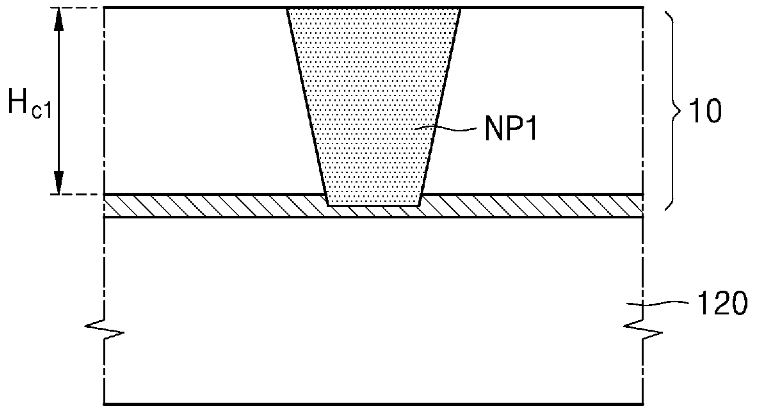

FIGS. 11A to 11C are views illustrating a method of manufacturing a lens layer of a color separation lens array according to a comparative example.

According to the manufacturing method of the comparative example, a first engraved pattern GP1 is formed using only a first dielectric layer LM1 without using a CMP stop layer shown in FIG. 10A, and as shown in FIG. 11B, a first nanopattern layer HM1 may be formed by filling the inside of the first engraved pattern GP1 with a material having a refractive index different from the first dielectric layer LM1. Then, a CMP process may be performed. In this case, it is difficult to remove only a portion of the first nanopattern layer HM1 exposed to the outside of the first engraved pattern GP1, and thus a certain portion of the first dielectric layer LM1 is also removed. Thus, the height $H_{c1}$ of the first dielectric layer LM1 in a first lens layer 10 manufactured as described above may be less than the height $H_{d1}$ of the first dielectric layer LM1 formed in the process shown in FIG. 11A. In addition, the first nanopattern layer HM1 and the first dielectric layer LM1 may have different CMP selectivities, and it may be difficult to satisfy the height $H_{c1}$ which is finally required height.

Moreover, it has been experimentally confirmed that thickness dispersion after CMP is greater than thickness dispersion after a deposition process before the CMP process. In the experiment, $SiO_2$ was deposited to a thickness of 470 nm, and to check dispersion in a process of forming a thickness of 420 nm through CMP, a plurality of pieces of sample data were measured from each of seven regions into which a color separation lens array was divided in a radial direction from the center thereof. The dispersion of a plurality of samples taken for the thickness of 470 nm before CMP after deposition was 6.9%, whereas the dispersion of a plurality of samples taken for the thickness of 420 nm after CMP increased to 9.4%. This increase in dispersion may be analyzed as being caused by two processes in which errors may occur.

In other words, in the manufacturing method of the comparative example, even when the first nanopattern layer HM1 and the first dielectric layer LM1 have similar CMP selectivities, the final height $H_{c1}$ is formed after the CMP process, and thus the final height $H_{c1}$ may be subject to significant dispersion. Unlike in the comparative example, in the manufacturing method of the embodiment, the height H1 of the first dielectric layer LM1 determined in the deposition process is maintained even in the final structure in the manufacturing method of the embodiment, thereby resulting in relatively low process dispersion.

FIG. 12A to 12E are views illustrating a method of manufacturing an image sensor according to another embodiment.

According to the manufacturing method of the current embodiment, an additional process is performed to form a second lens layer LE2 on the first lens layer LE1 formed as shown in FIG. 10D.

Figure 12A:
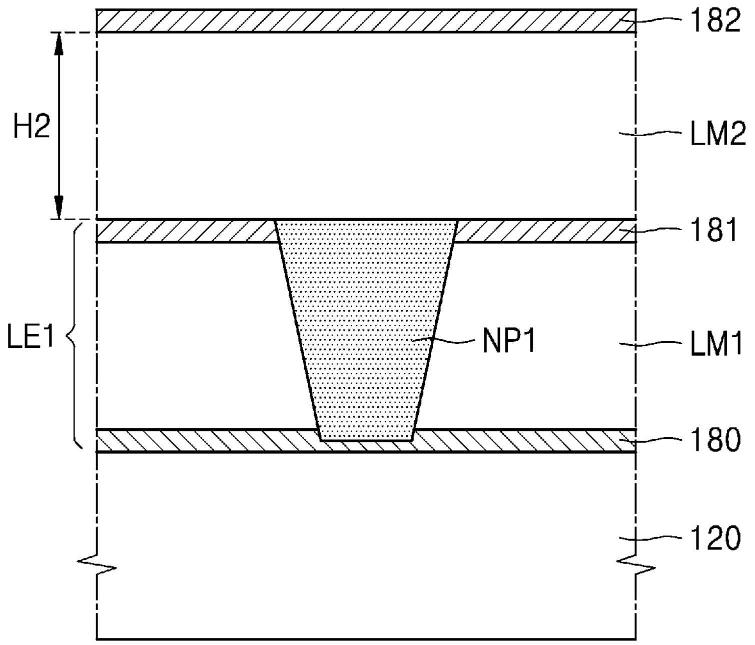
FIGS. 12A to 12E are views illustrating a method of manufacturing an image sensor according to another embodiment.

Referring to FIG. 12A, a second dielectric layer LM2 is formed on the first lens layer LE1, and a second CMP stop layer 182 is formed on the second dielectric layer LM2. The height H2 of the second dielectric layer LM2 is determined based on a required refractive index distribution.

The second CMP stop layer 182 includes a material for selectively performing CMP on a second nanopattern layer HM2 to be used for forming a second nanopost NP2 (described later). That is, the second CMP stop layer 182 may include a material, which is not easily removed when CMP is performed on the second nanopattern layer HM2. The second CMP stop layer 182 may include a material having CMP selectivity lower than the CMP selectivity of the second nanopattern layer HM2. The second CMP stop layer 182 may include $Al_2O_3$, SiN, or $HfO_2$. The thickness of the second CMP stop layer 182 may be within a range of about 5 nm to about 50 nm. The thickness of the second CMP stop layer 182 may be set by considering the material and thickness of the second nanopattern layer HM2. For example, among the regions of the second nanopattern layer HM2 shown in FIG. 12C, the thickness of a portion, which is to be formed as the second nanopost NP2 as shown in FIG. 12D, and the thickness of a portion, which is located on the upper surface of the second dielectric layer LM2 and is to be removed by CMP, may be considered to determine the thickness of the second CMP stop layer 182. The thickness of the second CMP stop layer 182 may be determined by considering CMP dispersion of a wafer as described above. The thickness of the second CMP stop layer 182 may be within a range of about 2% to about 30% of a thickness, which is to be removed by CMP from the second nanopattern layer HM2. The second CMP stop layer 182 may include the same material as the first CMP stop layer 181, but is not limited thereto.

Figure 12B:
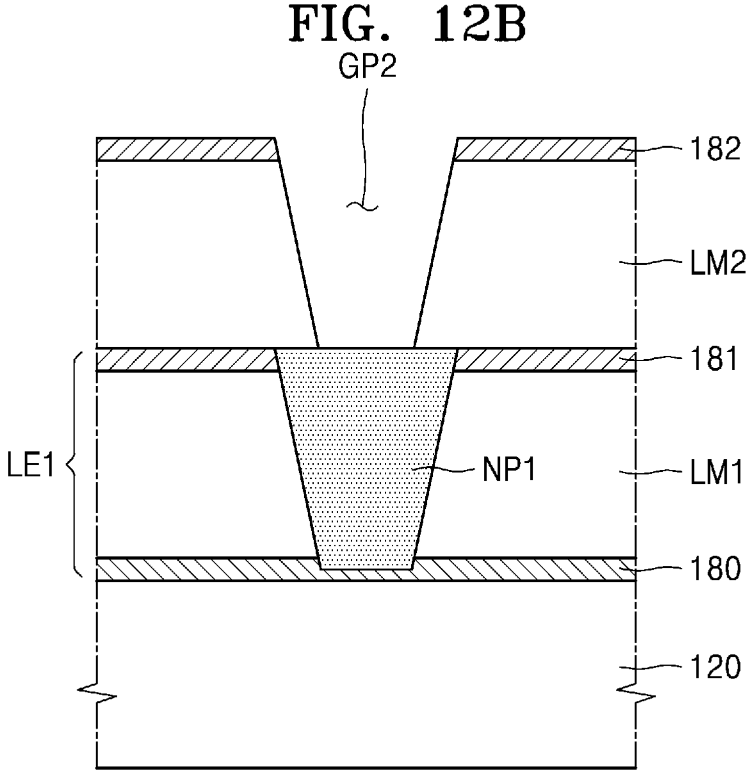

Referring to FIG. 12B, a second engraved pattern GP2 is formed by patterning both the second dielectric layer LM2 and the second CMP stop layer 182. The second engraved pattern GP2 may be formed at a position overlapping the first engraved pattern GP1 formed when the first lens layer LE1 is manufactured, that is, at a position overlapping the first nanopost NP1. At least a portion of the upper surface of the first nanopost NP1 of the first lens layer LE1 may be exposed through the second engraved pattern GP2. The center axis of the second engraved pattern GP2 is not required to be aligned with the center axis of the first nanoposts NP1, and may be shifted from the center axis of the first nanoposts NP1 by zero or more. The degree of shift may vary with positions. A photolithography process is used to form the second engraved pattern GP2. After forming a photoresist on the second CMP stop layer 182 shown in FIG. 12A and patterning the photoresist through an exposure process, the second engraved pattern GP2 may be formed by etching the second CMP stop layer 182 and the second dielectric layer LM2 at positions corresponding to an exposed pattern. For the etching of the second CMP stop layer 182 and the second dielectric layer LM2, for example, a Florin-based reactive ion etching process may be used.

Figure 12C:
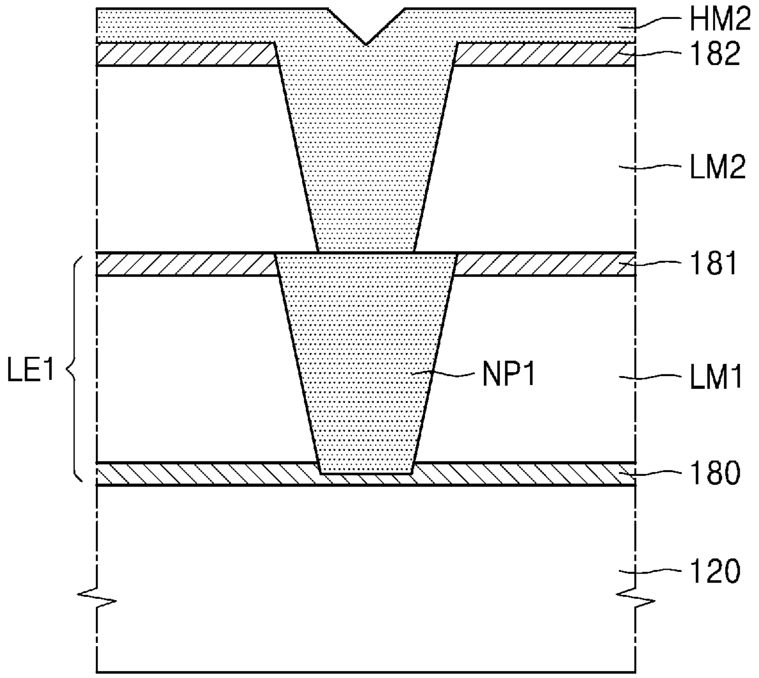
Figure 12D:
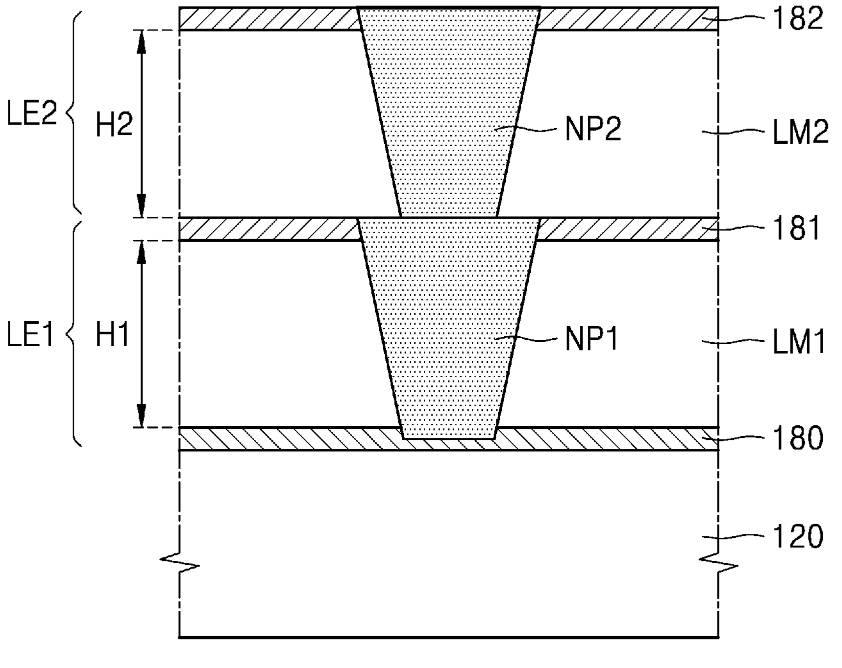

Referring to FIG. 12C, a material having a refractive index different from the refractive index of the first dielectric layer LM1 is applied to the inside of the second engraved pattern GP2 to form the second nanopattern layer HM2. The second nanopattern layer HM2 may fill the second engraved pattern GP2 and extend onto the upper surface of the second CMP stop layer 182. Because the upper surface of the first nanoposts NP1 is exposed through the second engraved pattern GP2, the first nanopost NP1 and the second nanopattern layer HM2 are directly connected to each other.

The second nanopattern layer HM2 may include a material having a refractive index different from the refractive index of the second dielectric layer LM2. For example, the second nanopattern layer HM2 may include c-Si, p-Si, a-Si, a Group Ill-V compound semiconductor (GaAs, GaP), GaN, GaAs, or the like), SiC, $TiO_2$, or SiN. When the second dielectric layer LM2 includes a material having a high refractive index, the second nanopattern layer HM2 may include a material having a relatively low refractive index such as $SiO_2$, a polymer material including SU-8 or PMMA, or SOG. Atomic layer deposition or other various deposition methods may be used to form the second nanopattern layer HM2. The second nanopattern layer HM2 may include the same material as the first nanopattern layer HM1 or may include a material having a refractive index equal to or similar to the refractive index of the first nanopattern layer HM1. However, embodiments are not limited thereto.

Next, as shown in FIG. 12D, the upper surface of the second nanopattern layer HM2 is planarized through a CMP process, thereby forming the second lens layer LE2 which includes the second nanopost NP2 having an intended shape and a second dielectric layer LM2 surrounding the second nanopost NP2. During the CMP process of the second nanopattern layer HM2, the second dielectric layer LM2 may be protected by the second CMP stop layer 182 formed on the upper surface of the second dielectric layer LM2, and the height H2 of the second dielectric layer LM2 may be maintained. The height H2 which is set in the process shown in FIG. 12A may be maintained even after the CMP process.

Figure 12E:
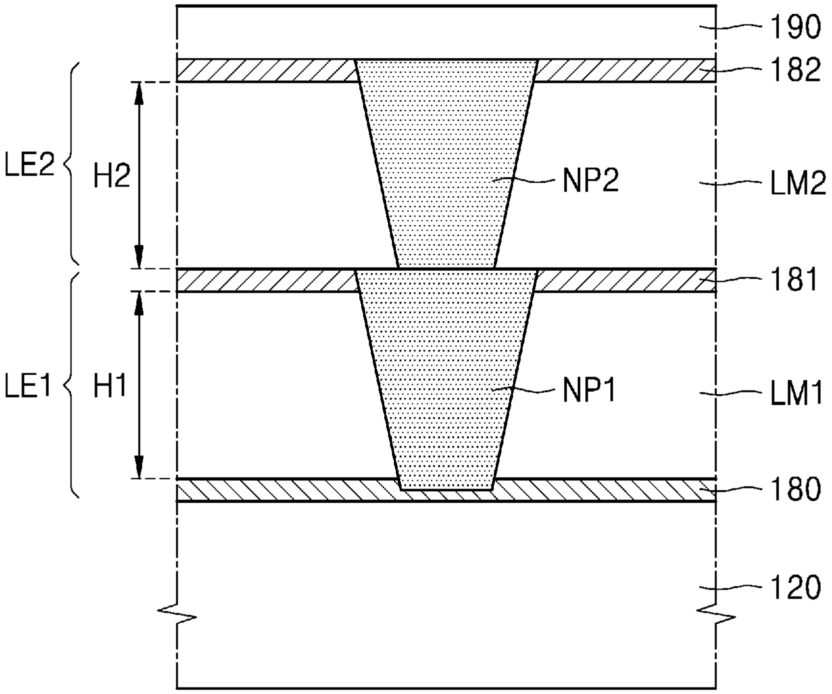

Next, as shown in FIG. 12E, a protective layer 190 may be further formed on the second lens layer LE2. The protective layer 190 may include a material serving as an anti-reflection layer.

According to the manufacturing method, an image sensor including a color separation lens array such the color separation lens array 135 having a two-layer structure as shown in FIG. 8B may be manufactured. The first nanopost NP1 and the second nanopost NP2 formed at corresponding positions in the first lens layer LE1 and the second lens layer LE2 may be directly connected to each other without an intervening layer therebetween, and the heights H1 and H2 of the first lens layer LE1 and the second lens layer LE2 may be reliably satisfied, thereby easily obtaining an intended refractive index distribution.

FIGS. 13A to 13D are views illustrating a method of manufacturing an image sensor according to a comparative example.

The manufacturing method of the comparative example relates to an additional process of forming a second lens layer 20 on a first lens layer 10 such as the first lens layer LE1 shown in FIG. 11C.

Figure 13A:
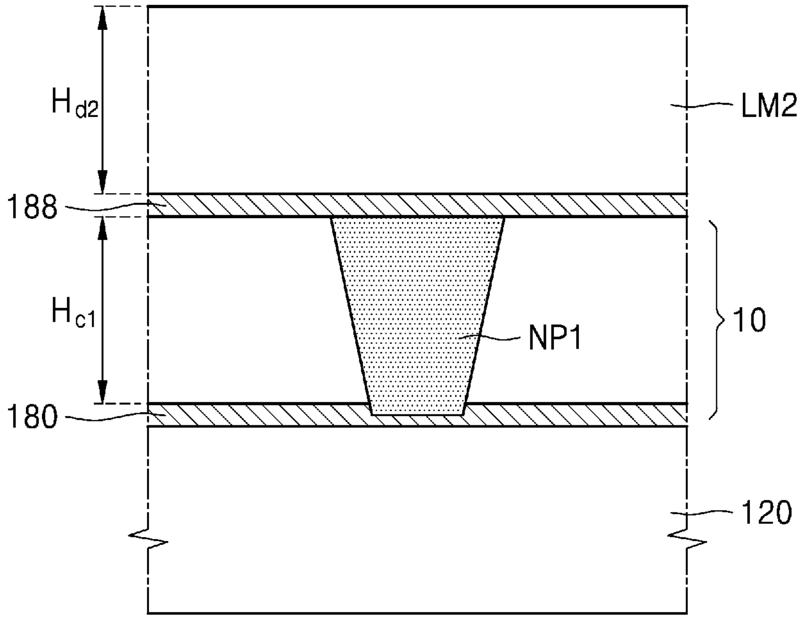
FIGS. 13A to 13D are views illustrating a method of manufacturing an image sensor according to a comparative example.

Referring to FIG. 13A, an etch stop layer 188 is formed on the first lens layer 10, and a second dielectric layer LM2 is formed on the etch stop layer 188. The etch stop layer 188 protects the first lens layer 10 from being damaged during the process of forming the second lens layer 20. The deposition height $H_{d2}$ of the second dielectric layer LM2 is set by considering a final height $H_{c2}$ after a CMP process.

Figure 13B:
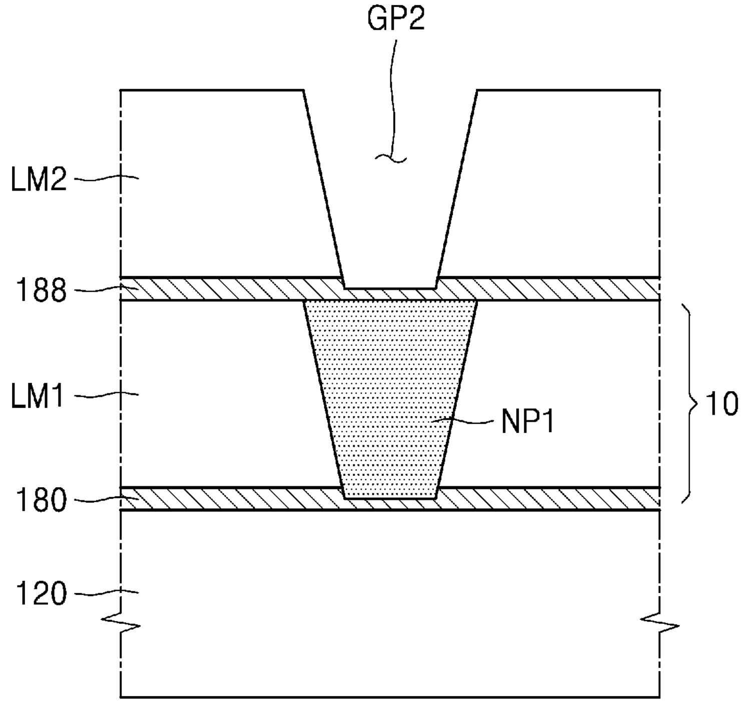

Next, as shown in FIG. 13B, a second engraved pattern GP2 is formed by patterning the second dielectric layer LM2.

Due to the etch stop layer 188 formed on an entire upper surface of the first lens layer 10, the first nanopost NP1 is not exposed through the second engraved pattern GP2.

Figure 13C:
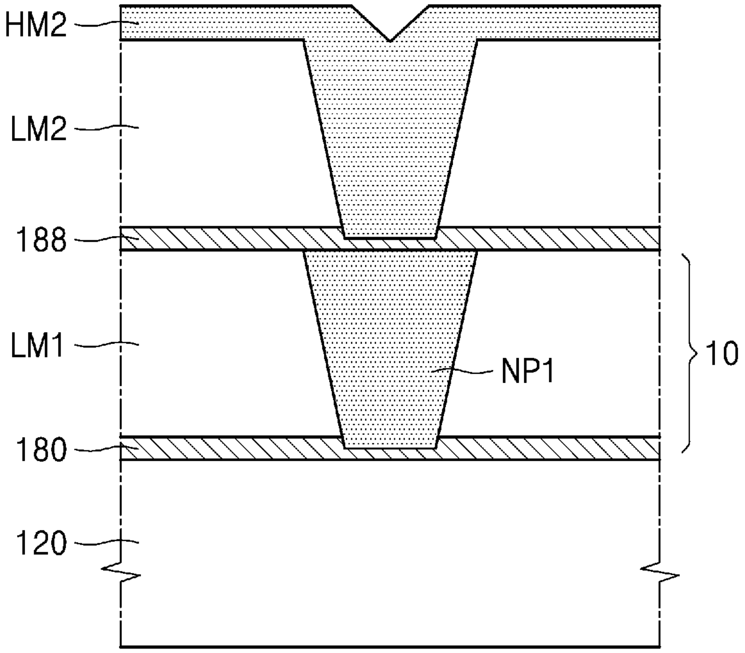
Figure 13D:
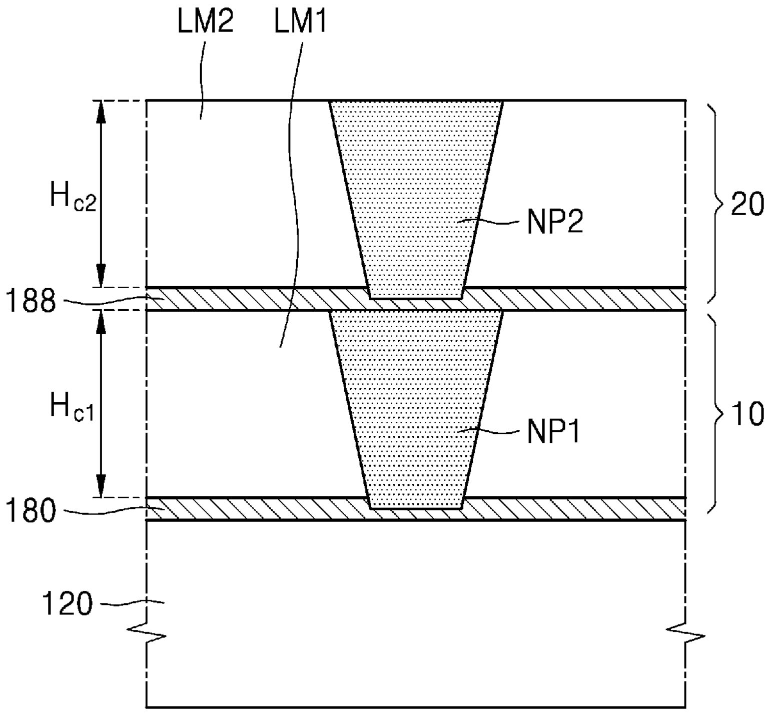

Next, as shown in FIG. 13C, a second nanopattern layer HM2 including a material different from a material of the second dielectric layer LM2 is formed in the second engraved pattern GP2 and on the upper surface of the second dielectric layer LM2, and the second nanopattern layer HM2 is partially removed through a CMP process, thereby forming a structure including the first lens layer 10 and the second lens layer 20 as shown in FIG. 13D. In this case, the height $H_{c2}$ of the second lens layer 20 is different from the deposition height $H_{d2}$ of the second dielectric layer LM2, and also has relatively wide dispersion because of the addition of the CMP process. In addition, the first nanopost NP1 and the second nanopost NP2 provided at corresponding positions are not connected to each other due to the etch stop layer 188 arranged therebetween. This structure may make it difficult to obtain an intended refractive index distribution and may serve as a factor lowering the efficiency of color separation.

FIG. 14A to 14D are views illustrating a method of manufacturing an image sensor according to another embodiment.

The manufacturing method of the current embodiment is different from the manufacturing method described with reference to FIGS. 12A to 12D in that a first nanopost NP1 of a first lens layer LE1 is not connected to a second nanopost NP2 of a second lens layer LE2.

Figure 14A:
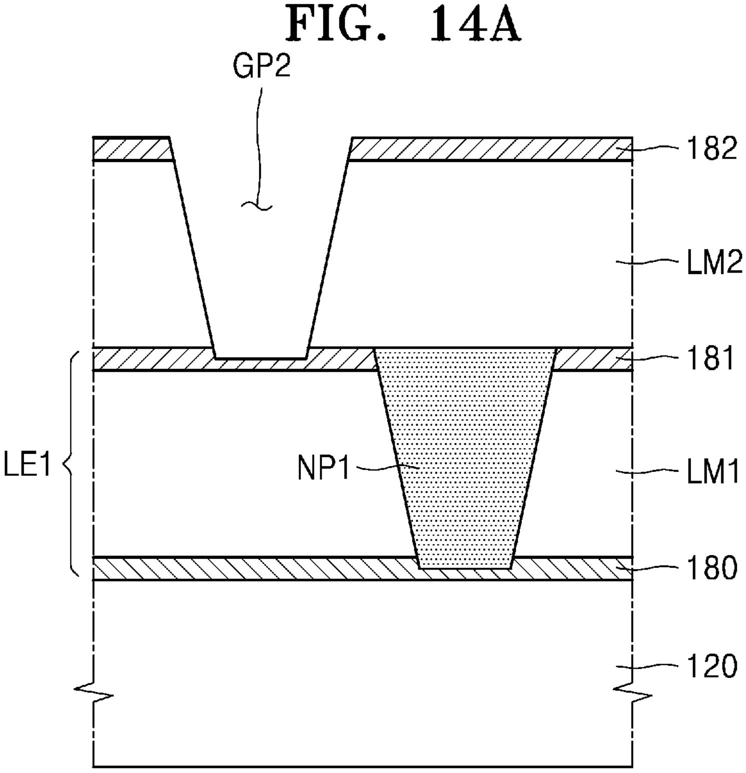
FIGS. 14A to 14D are views illustrating a method of manufacturing an image sensor according to another embodiment.

Referring to FIG. 12A, after forming a second dielectric layer LM2 and a second CMP stop layer 182 on the first lens layer LE1, the second dielectric layer LM2 and the second CMP stop layer 182 are patterned together to form a second engraved pattern GP2 as shown in FIG. 14A. The second engraved pattern GP2 may not overlap the first nanopost NP1. A photolithography process and an etching process are performed to form the second engraved pattern GP2, and during the etching process, the second CMP stop layer 182 may serve as an etch stop layer. That is, the first lens layer LE1 may not be damaged during the etching process for forming the second engraved pattern GP2.

Figure 14B:
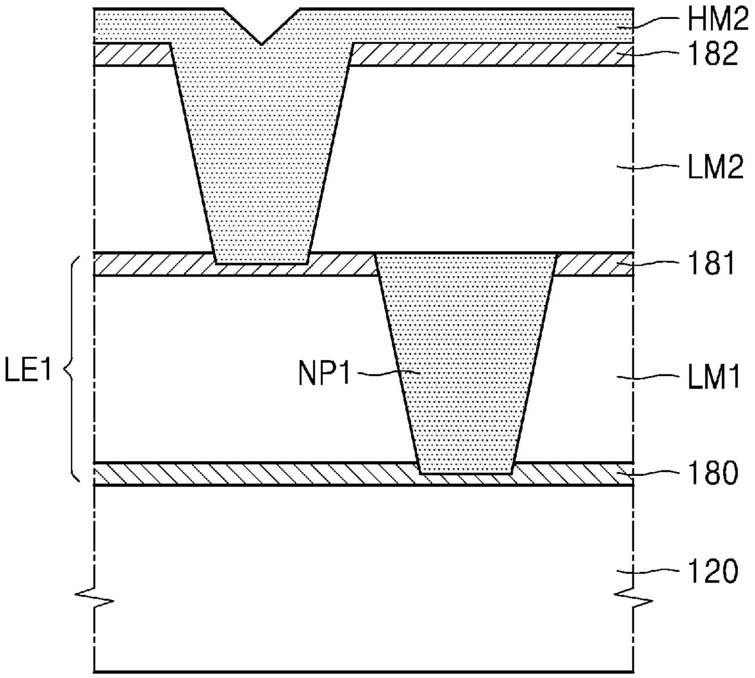
Figure 14C:
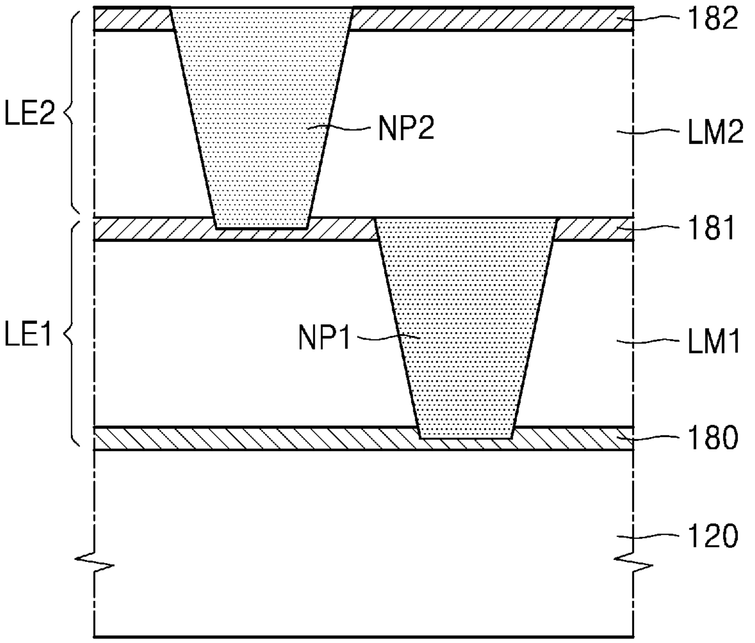
Figure 14D:
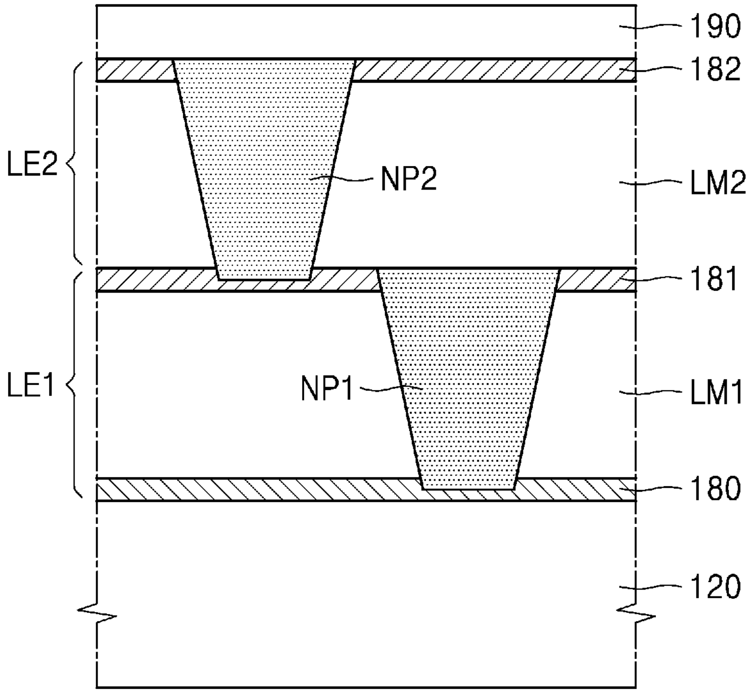

Next, as shown in FIGS. 14B to 14D, a second nanopattern layer HM2 including a material having a refractive index different from the refractive index of the second dielectric layer LM2 may be formed in the second engraved pattern GP2 and on the second CMP stop layer 182; a CMP process may be performed on the second nanopattern layer HM2 to form the second lens layer LE2; and then a protective layer 190 serving as an anti-reflection layer may be formed on the second lens layer LE2.

According to the manufacturing method, an image sensor, which includes a color separation lens array having a two-layer structure like the color separation lens array 135 illustrated in FIG. 8C, may be manufactured.

In the description above, example methods of manufacturing a color separation lens array in which nanoposts are arranged in a single layer or two layers have been described, and the manufacturing methods may also be used to manufacture a color separation lens array in which nanoposts are arranged in three or more layers. A type in which upper and lower nanoposts are connected to each other or a type in which upper and lower nanoposts are not connected to each other has been described above for a structure of a color separation lens array in which nanoposts are arranged in two layers. However, both the types may be applied to a single color separation lens array.

Figure 15:
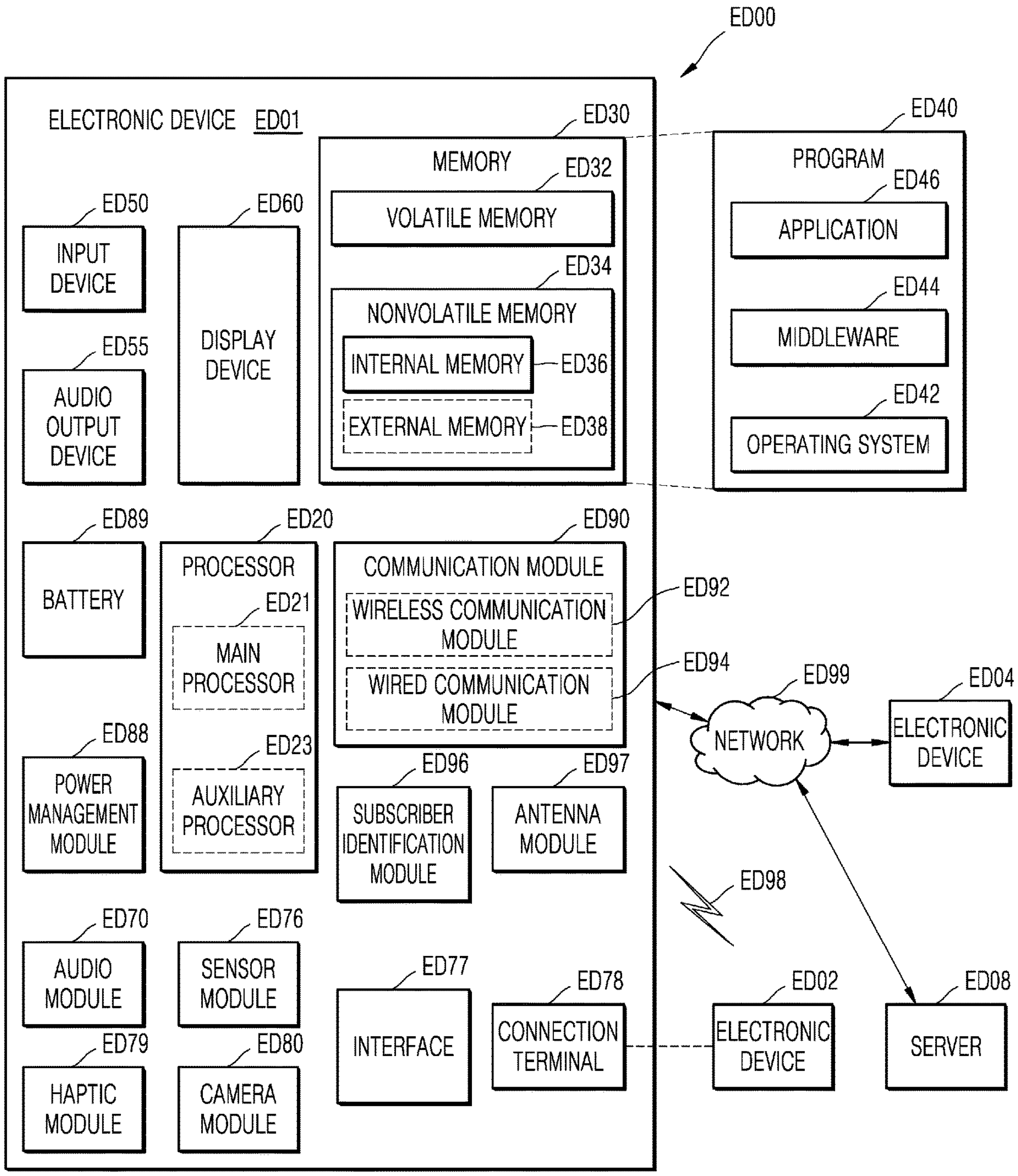
FIG. 15 is a block diagram schematically illustrating an electronic device including an image sensor according to an example embodiment.
Figure 16:
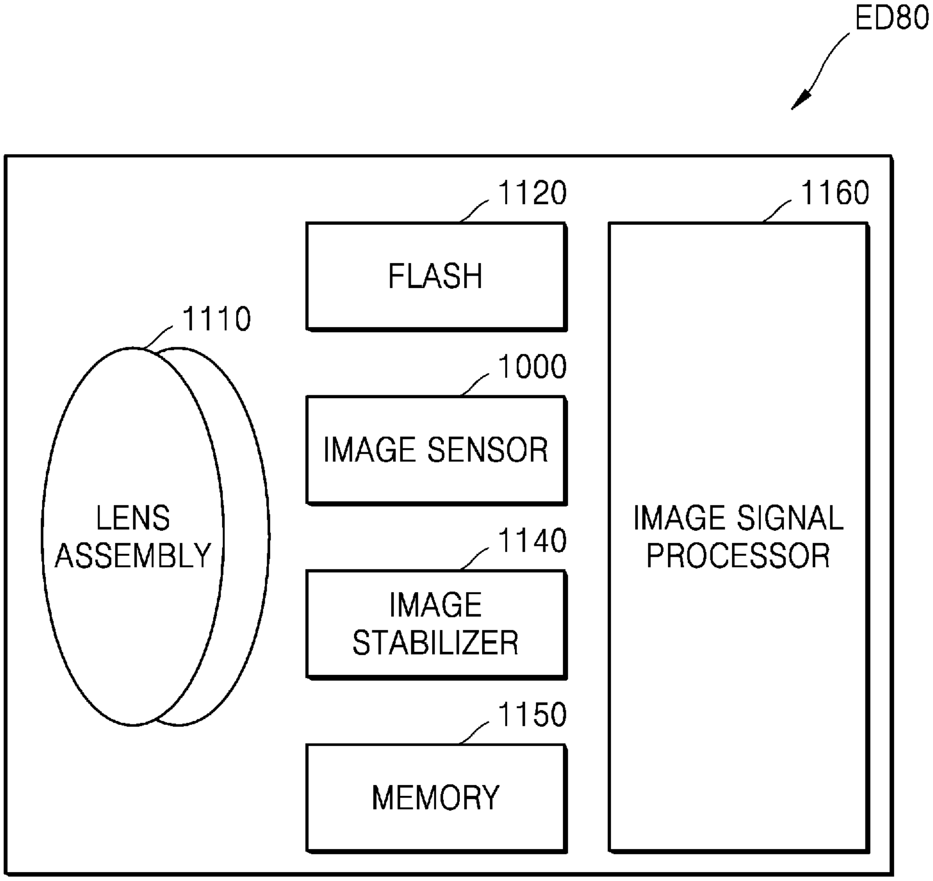
FIG. 16 is a block diagram schematically illustrating a camera module included in the electronic device shown in FIG. 15.

FIG. 15 is a block diagram schematically illustrating an electronic device ED01 including an image sensor according to an example embodiment, and FIG. 16 is a block diagram schematically illustrating a camera module ED 80 included in the electronic device ED01 shown in FIG. 15.

FIG. 15 illustrates, as an example, the electronic device ED01 including an image sensor 1000. Referring to FIG. 15, in a network environment ED00, the electronic device ED01 may communicate with another electronic device ED02 through a first network ED98 (a near-field wireless communication network or the like) or may communicate with another electronic device ED04 and/or a server ED08 through a second network ED99 (a far-field wireless communication network or the like). The electronic device ED01 may communicate with the electronic device ED04 through the server ED08. The electronic device ED01 may include a processor ED20, a memory ED30, an input device ED50, a sound output device ED55, a display device ED60, an audio module ED70, a sensor module ED76, an interface ED77, a haptic module ED79, a camera module ED80, a power management module ED88, a battery ED89, a communication module ED90, a subscriber identification module ED96, and/or an antenna module ED97. Some (the display device ED60, etc.) of the components may be omitted from the electronic device ED01, or other components may be added to the electronic device ED01. Some of the components may be implemented in one integrated circuit. For example, the sensor module ED76 (a fingerprint sensor, an iris sensor, an illuminance sensor, etc.) may be embedded in the display device ED76 (a display or the like).

The processor ED20 may execute software (a program ED40 or the like) to control one or more other components (hardware or software components, etc.) of the electronic device ED01 connected to the processor ED20, and may perform a variety of data processing or operations. As a portion of the data processing or operations, the processor ED20 may load instructions and/or data received from other components (the sensor module ED76, the communication module ED90, etc.) into a volatile memory ED32, process the instructions and/or data stored in the volatile memory ED32, and store result data in a nonvolatile memory ED34. The processor ED20 may include a main processor ED21 (a center processing unit, an application processor, or the like) and an auxiliary processor ED23 (a GPU, an image signal processor, a sensor hub processor, a communication processor, or the like), which is operated independently or together with the main processor ED21. The auxiliary processor ED23 may consume less power than the main processor ED21 and may perform specialized functions.

The auxiliary processor ED23 may control functions and/or states related to some (the display device ED60, the sensor module ED76, the communication module ED90, etc.) of the components of the electronic device ED01 on behalf of the main processor ED21 while the main processor ED21 is in an inactive (e.g., sleep) state or together with the main processor ED21 while the main processor ED21 is in an active (e.g., application execution) state. The auxiliary processor ED23 (an image signal processor, a communication processor or the like) may be implemented as a portion of other functionally relevant components (the camera module ED80, the communication module ED90, etc.).

The memory ED30 may store a variety of data required by the components (the processor ED20, the sensor module ED76, etc.) of the electronic device ED01. The data may include, for example, software (the program ED40, etc.) and input data and/or output data for commands related thereto.

The memory ED30 may include the volatile memory ED32 and/or the nonvolatile memory ED34.

The program ED40 may be stored as software in the memory ED30, and may include an operating system ED42, middleware ED44, and/or an application ED46.

The input device ED50 may receive commands and/or data to be used for the components (the processor ED20, etc.) of the electronic device ED01 from the outside (a user, etc.) of the electronic device ED01. The input device ED50 may include a microphone, a mouse, a keyboard, and/or a digital pen (a stylus pen or the like).

The audio output device ED55 may output an audio signal to the outside of the electronic device ED01. The audio output device ED55 may include a speaker and/or a receiver. The speaker may be used for general purposes such as multimedia playback or record playback, and the receiver may be used to receive incoming calls. The receiver may be provided as a portion of the speaker or may be implemented as a separate device.

The display device ED60 may visually provide information to the outside of the electronic device ED01. The display device ED60 may include a display, a hologram device, or a projector, and a control circuit for controlling devices. The display device ED60 may include touch circuitry set to sense a touch, and/or sensor circuitry (a pressure sensor, etc.) configured to measure the intensity of force generated by the touch.

The audio module ED70 may convert sound into an electrical signal, and vice versa. The audio module ED70 may obtain sound through the input device ED50, or may output sound through the audio output device ED55 and/or speakers and/or headphones of another electronic device (the electronic device ED02 or the like) directly or wirelessly connected to the electronic device ED01.

The sensor module ED76 may detect an operating state (power, temperature, etc.) of the electronic device ED01 or an external environmental state (user status, etc.), and may generate an electrical signal and/or a data value corresponding to the detected state. The sensor module ED76 may include a gesture sensor, a gyro sensor, a barometric sensor, a magnetic sensor, an acceleration sensor, a grip sensor, a proximity sensor, a color sensor, an infrared (IR) sensor, a biological sensor, a temperature sensor, a humidity sensor, and/or an illuminance sensor.

The interface ED77 may support one or more designated protocols, which may be used to directly or wirelessly connect the electronic device ED01 with other electronic devices (the electronic device ED02, etc.). The interface ED77 may include a high definition multimedia interface (HDMI), a universal serial bus (USB) interface, a secure digital (SD) card interface, and/or an audio interface.

A connection terminal ED78 may include a connector through which the electronic device ED01 may be physically connected to other electronic devices (the electronic device ED02, etc.). The connection terminal ED78 may include an HDMI connector, a USB connector, an SD card connector, and/or an audio connector (a headphone connector, etc.).

The haptic module ED79 may convert an electrical signal into a mechanical stimulus (vibration, movement, etc.) or an electrical stimulus that a user may perceive through tactile sensation or kinesthesia. The haptic module ED79 may include a motor, a piezoelectric element, and/or an electric stimulation device.

The camera module ED80 may capture a still image and a moving image. The camera module ED80 may include a lens assembly having one or more lenses, the image sensor 1000 described with reference to FIG. 1, an image signal processor, and/or a flash. The lens assembly included in the camera module ED80 may collect light coming from an object to be imaged.

The power management module ED88 may manage power supplied to the electronic device ED01. The power management module ED88 may be implemented as a portion of a power management integrated circuit PMIC.

The battery ED89 may supply power to components of the electronic device ED01. The battery ED89 may include a non-rechargeable primary battery, a rechargeable secondary battery, and/or a fuel cell.

The communication module ED90 may support establishment of a direct (wired) communication channel and/or a wireless communication channel between the electronic device ED01 and other electronic devices (the electronic device ED02, the electronic device ED04, the server ED08, etc.), and communication through the established communication channel. The communication module ED90 operates independently of the processor ED20 (an application processor, etc.) and may include one or more communication processors supporting direct communication and/or wireless communication. The communication module ED90 may include a wireless communication module ED92 (a cellular communication module, a short-range wireless communication module, a global navigation satellite system (GNSS), or the like) and/or a wired communication module ED94 (a local region network (LAN) communication module, a power line communication module, or the like). A corresponding communication module from among these communication modules may communicate with other electronic devices through the first network ED98 (a local region network such as Bluetooth, WiFi Direct, or infrared data association (IrDA)) or the second network ED99 (a telecommunication network such as a cellular network, the Internet, or computer networks (LAN, WAN, etc.)). These various types of communication modules may be integrated into a single component (a single chip or the like) or may be implemented as a plurality of separate components (multiple chips). The wireless communication module ED92 may identify and authenticate the electronic device ED01 within a communication network such as the first network ED98 and/or the second network ED99 using subscriber information (an international mobile subscriber identifier (IMSI), etc.) stored in the subscriber identity module ED96.

The antenna module ED97 may transmit and/or receive signals and/or power to and/or from the outside (other electronic devices, etc.). An antenna may include a radiator made of a conductive pattern formed on a substrate (a PCB, etc.). The antenna module ED97 may include one or more such antennas. When a plurality of antennas are included in the antenna module ED97, the communication module ED90 may select an antenna suitable for a communication method used in a communication network, such as the first network ED98 and/or the second network ED99, among the plurality of antennas. Signals and/or power may be transmitted or received between the communication module ED90 and other electronic devices through the selected antenna. Other components (an RFIC, etc.) besides the antenna may be included as part of the antenna module ED97.

Some of the components may be connected to each other and exchange signals (commands, data, etc.) through a communication method between peripheral devices (a bus, general purpose input and output (GPIO), a serial peripheral interface (SPI), a mobile industry processor interface (MIPI), or the like).

Commands or data may be transmitted or received between the electronic device ED01 and an external device such as the electronic device ED04 through the server ED08 connected to the second network ED99. The other electronic devices ED02 and ED04 may be the same as or different from the electronic device ED01. All or some of the operations of the electronic device ED01 may be executed by one or more of the other electronic devices ED02, ED04, and ED08. For example, when the electronic device ED01 needs to perform certain functions or services, the electronic device ED01 may request one or more other electronic devices to perform some or all of the functions or services instead of directly executing the functions or services. One or more other electronic devices that have received the request may execute an additional function or service related to the request, and may transfer results of the execution to the electronic device ED01. To this end, cloud computing, distributed computing, and/or client-server computing techniques may be used.

Referring to FIG. 16, the camera module ED80 may include a lens assembly 1110, a flash 1120, an image sensor 1000 (refer to the image sensor 1000 shown in FIG. 1 or the like), an image stabilizer 1140, a memory 1150 (a buffer memory, etc.), and/or an image signal processor 1160. The lens assembly 1110 may collect light coming from an object to be imaged. The camera module ED80 may include a plurality of lens assemblies 1110, and in this case, the camera module ED80 may be a dual camera, a 360-degree camera, or a spherical camera. Some of the plurality of lens assemblies 1110 may have the same lens properties (field of view, focal length, autofocus, F Number, optical zoom, etc.) or different lens properties. Each of the lens assemblies 1110 may include a wide-angle lens or a telephoto lens.

The flash 1120 may emit light used to enhance light emitted or reflected from an object. The flash 1120 may include one or more light emitting diodes (a red-green-blue (RGB) LED, a white LED, an infrared LED, an ultraviolet LED, etc.), and/or a xenon lamp.

The image sensor 1000 may be the image sensor 1000 described with reference to FIG. 1, and may include any one of the pixel arrays 1100, 1101, and 1102 of the embodiments described above. The image sensor 1000 may be manufactured by the manufacturing method described with reference to FIGS. 10A to 10E, or FIGS. 12A to 12E, or FIGS. 14A to 14D. The image sensor 1000 may acquire an image of an object by receiving light output or reflected from the object and transmitted through the lens assembly 1110, and converting the light into an electrical signal. The image sensor 1000 may include one or more sensors selected from image sensors having different properties, such as an RGB sensor, a black and white (BW) sensor, an IR sensor, or a UV sensor. Each of the sensors included in the image sensor 1000 may be provided as a CCD sensor and/or a CMOS sensor.

The image stabilizer 1140 may move one or more lenses included in the lens assembly 1110 or the image sensor 1000 in a specific direction in response to a movement of the camera module ED80 or the electronic device ED01 including the camera module ED80, or may control operating characteristics of the image sensor 1000 (adjustment of read-out timing, etc.) to compensate for negative effects caused by movement. The image stabilizer 1140 may detect a movement of the camera module ED80 or the electronic device ED01 by using a gyro sensor or an acceleration sensor arranged inside or outside the camera module ED80. The image stabilizer 1140 may be an optical image stabilizer.

In the memory 1150, some or all of data obtained through the image sensor 1000 may be stored for the next image processing operation. For example, when a plurality of images are obtained at a high speed, the obtained original data (Bayer-patterned data, high-resolution data, or the like) may be stored in the memory 1150 and only a low-resolution image may be displayed. Then, the original data of a selected image (user selection, etc.) may be transferred to the image signal processor 1160. The memory 1150 may be integrated into the memory ED30 of the electronic device ED01 or may be configured as a separate memory that may be independently operated.

The image signal processor 1160 may perform one or more image processes on an image obtained through the image sensor 1000 or image data stored in the memory 1150. In addition, the one or more image processes may include depth map generation, three-dimensional modeling, panorama generation, feature point extraction, image synthesis, and/or image compensation (noise reduction, resolution adjustment, brightness adjustment, blurring, sharpening, softening, etc.). The image signal processor 1160 may control (exposure time control, read-out timing control, etc.) components (the image sensor 1000, etc.) included in the camera module ED80. An image processed by the image signal processor 1160 may be stored again in the memory 1150 for additional processing or may be provided to external components (the memory ED30, the display device ED60, the electronic device ED02, the electronic device ED04, the server ED08, etc.) of the camera module ED80. The image signal processor 1160 may be integrated into the processor ED20 or may be configured as a separate processor that operates independently of the processor ED20. When the image signal processor 1160 is provided separately from the processor ED20, an image processed by the image signal processor 1160 may be displayed on the display device ED60 after being further processed by the processor ED20.

The electronic device ED01 may include a plurality of camera modules ED80 having different attributes or functions. In this case, one of the plurality of camera modules ED80 may be a wide-angle camera, and another of the plurality of camera modules ED80 may be a telephoto camera. Similarly, one of the plurality of camera modules ED80 may be a front camera, and another of the plurality of camera modules ED80 may be a rear camera.

According to embodiments, the image sensor 1000 may be applied to a mobile phone or smartphone, a tablet or smart tablet, a digital camera or camcorder, a laptop computer, a television or smart television, and the like. For example, the smartphone or the smart tablet may include a plurality of high-resolution cameras each having a high-resolution image sensor mounted thereon. The high-resolution cameras may be used to extract depth information of objects in an image, adjust out of focus of an image, or automatically identify objects in an image.

In addition, the image sensor 1000 may be applied to a smart refrigerator, a security camera, a robot, a medical camera, and the like. For example, the smart refrigerator may automatically recognize food contained in the smart refrigerator by using the image sensor 1000, and may inform a user of whether a specific food is contained in the smart refrigerator, the type of food put into or out of the smart refrigerator, and the like through a smartphone. The security camera may provide an ultra-high-resolution image and may recognize an object or a person in the ultra-high-resolution image even in a dark environment owing to high sensitivity of the security camera. The robot may be sent to a disaster or industrial site that cannot be directly accessed by humans and may provide high-resolution images. The medical camera may provide a high-resolution image for diagnosis or surgery, and may have a dynamically adjustable field of view.

In addition, the image sensor 1000 may be applied to a vehicle. The vehicle may include a plurality of vehicle cameras arranged at various positions. Each of the vehicle cameras may include the image sensor image 1000 according to an example embodiment. The vehicle may use the vehicle cameras to provide a driver with various information about the interior or surroundings of the vehicle, and may provide information necessary for autonomous driving by automatically recognizing objects or people in images.

While the image sensors including the color separation lens arrays, and the electronic devices including the image sensors have been described according to embodiments with reference to the accompanying drawings, these are merely examples, and those of ordinary skill in the art will understand that various modifications and other embodiments may be made therein. Therefore, the embodiments should be considered in a descriptive sense only and not for purposes of limitation. The scope of the present disclosure is not limited to the embodiments described above but should be defined by the appended claims and equivalents thereof.

As described above, according to the one or more of the above embodiments, the image sensor includes a color separation lens array capable of splitting and condensing incident light according to the wavelength of the incident light without absorbing or blocking the incident light, and the color separation lens array has a structure capable of reducing thickness dispersion that may occur in manufacturing processes, thereby improving the efficiency of color separation.

Each of the manufacturing methods described above provides an image sensor including a color separation lens array in which the shape dimensions of a pattern of a low refractive index material and a high refractive index material are reliably guaranteed for an intended refractive index distribution.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An image sensor comprising:
- a sensor substrate comprising a plurality of light sensing cells;
- a spacer layer provided on the sensor substrate, the spacer layer being transparent; and
- a color separation lens array provided on the spacer layer, wherein the color separation lens array comprises:
  - a first lens layer comprising a first nanopost having a sub-wavelength shape dimension and a first peripheral material provided around the first nanopost; and
  - a first chemical mechanical polishing (CMP) stop layer provided on an entire upper surface of the first peripheral material,
  - wherein the first CMP stop layer is not provided on an upper surface of the first nanopost.

2. The image sensor of claim 1, wherein the color separation lens array further comprises:
- a second lens layer provided on the first lens layer, the second lens layer comprising a second nanopost having a sub-wavelength shape dimension and a second peripheral material provided around the second nanopost; and
- a second CMP stop layer provided on an entire upper surface of the second peripheral material,
- wherein the second CMP stop layer is not provided on an upper surface of the second nanopost.

3. The image sensor of claim 2, wherein the first nanopost is in direct contact with the second nanopost.

4. The image sensor of claim 3, wherein a separation distance between a center axis of the first nanopost and a center axis of the second nanopost is more than zero.

5. The image sensor of claim 4, wherein the separation distance increases as a position of the first nanopost and the second nanopost from a center of the image sensor increases.

6. The image sensor of claim 2, wherein the first CMP stop layer or the second CMP stop layer comprises Al2O3, SiN, or HfO2.

7. The image sensor of claim 2, wherein the first CMP stop layer or the second CMP stop layer has a thickness of about 5 nm to about 50 nm.

8. The image sensor of claim 1, further comprising an etch stop layer arranged between the spacer layer and the first lens layer.

9. The image sensor of claim 1, further comprising a protective layer arranged on the color separation lens array.

10. The image sensor of claim 1, wherein the color separation lens array is configured to separate a first wavelength and a second wavelength from incident light and condense the first wavelength and the second wavelength respectively on a first pixel and a second pixel of the plurality of light sensing cells.

11. The image sensor of claim 1, further comprising a color filter array provided between the spacer layer and the sensor substrate.

12. The image sensor of claim 1, wherein the color separation lens array further comprises a second lens layer provided on the first lens layer, the second lens layer comprising a second nanopost having a sub-wavelength shape dimension and a second peripheral material provided around the second nanopost, and
- wherein the second lens layer is provided directly on the first nanopost.

13. The image sensor of claim 1, wherein the second nanopost is provided directly on the first nanopost.

14. The image sensor of claim 1, wherein the second peripheral material is provided directly on the first nanopost.

15. The image sensor of claim 1, wherein the first CMP stop layer comprises a material having a lower CMP selectivity than a material of the first nanopost.

16. An image sensor comprising:
- a sensor substrate comprising a plurality of light sensing cells;
- a spacer layer provided on the sensor substrate, the spacer layer being transparent; and
- a color separation lens array provided on the spacer layer, wherein the color separation lens array comprises:
  - a first lens layer comprising a plurality of first nanoposts having a first sub-wavelength shape dimension and a first peripheral material provided around the plurality of first nanoposts;
  - a first chemical mechanical polishing (CMP) stop layer provided on an entire upper surface of the first peripheral material, wherein the first CMP stop layer is not provided on an upper surface of the plurality of first nanoposts; and a second lens layer comprising a plurality of second nanoposts having a second sub-wavelength shape dimension and a second peripheral material provided around the plurality of second nanoposts.

17. The image sensor of claim 16, wherein the second lens layer is provided directly on one or more of plurality of first nanoposts.

18. The image sensor of claim 16, wherein one or more of the plurality of second nanoposts is provided directly on one or more of plurality of first nanoposts.

19. The image sensor of claim 16, wherein the second peripheral material is provided directly on one or more of plurality of first nanoposts.

20. The image sensor of claim 16, wherein the first CMP stop layer comprises a material having a lower CMP selectivity than a material of the first nanopost.

* * * * *